(12) United States Patent
Sakotsubo

(10) Patent No.: US 9,812,505 B2
(45) Date of Patent: Nov. 7, 2017

(54) NON-VOLATILE MEMORY DEVICE CONTAINING OXYGEN-SCAVENGING MATERIAL PORTIONS AND METHOD OF MAKING THEREOF

(71) Applicant: SANDISK TECHNOLOGIES LLC

(72) Inventor: Yukihiro Sakotsubo, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 8 days.

(21) Appl. No.: 15/157,945

(22) Filed: May 18, 2016

(65) Prior Publication Data

US 2017/0141161 A1 May 18, 2017

Related U.S. Application Data

(60) Provisional application No. 62/255,731, filed on Nov. 16, 2015.

(51) Int. Cl.
| | |
|---|---|
| H01L 47/00 | (2006.01) |
| H01L 27/24 | (2006.01) |
| H01L 45/00 | (2006.01) |
| H01L 23/528 | (2006.01) |

(52) U.S. Cl.
CPC ........ *H01L 27/2481* (2013.01); *H01L 23/528* (2013.01); *H01L 27/2436* (2013.01); *H01L 45/08* (2013.01); *H01L 45/1233* (2013.01); *H01L 45/1246* (2013.01); *H01L 45/146* (2013.01)

(58) Field of Classification Search
CPC . H01L 27/2481; H01L 45/08; H01L 45/1233; H01L 45/1246; H01L 45/1253
USPC ................................... 257/4, 5, 7
See application file for complete search history.

(56) References Cited

U.S. PATENT DOCUMENTS

| | | | |
|---|---|---|---|
| 5,172,338 A | 12/1992 | Mehrotra et al. | |
| 5,915,167 A | 6/1999 | Leedy | |
| 8,283,228 B2 | 10/2012 | Alsmeier | |
| 9,224,951 B1 * | 12/2015 | Wang | .............. H01L 45/145 |
| 9,343,507 B2 | 5/2016 | Takaki | |

(Continued)

OTHER PUBLICATIONS

International Search Report and Written Opinion of the International Search Authority for PCT/US2015/041947, filed Jul. 24, 2015, dated Dec. 1, 2015, 12 pages.
Kozicki, M. et al., "Multi-bit Memory Using Programmable Metallization Cell Technology," Proceedings of the International Conference on Electronic Devices and Memory, Grenoble, France, pp. 48-53, (Jun. 12-17, 2005).

(Continued)

*Primary Examiner* — Matthew E Warren
(74) *Attorney, Agent, or Firm* — The Marbury Law Group PLLC

(57) ABSTRACT

A middle electrode can be inserted at each intersection between a non-volatile memory element layer located on an electrically conductive word line and a non-linear element located on an electrically conductive bit line in a three-dimensional memory device. An oxygen-scavenging material portion can be provided between each electrically conductive word line and an adjoining insulator layer to scavenge oxygen from contacting portions of the non-volatile memory element layer, thereby forming an oxygen-scavenged non-volatile memory element portion that facilitates programming. The middle electrode and the oxygen-scavenged non-linear memory element portion can alter the programming characteristics of the non-volatile memory cells to provide easier and more reliable programming.

10 Claims, 29 Drawing Sheets

(56) References Cited

U.S. PATENT DOCUMENTS

| | | |
|---|---|---|
| 2003/0185048 A1 | 10/2003 | Fricke et al. |
| 2009/0001344 A1 | 1/2009 | Schricker et al. |
| 2012/0112156 A1 | 5/2012 | Park et al. |
| 2012/0147648 A1 | 6/2012 | Scheuerlein |
| 2012/0211722 A1 | 8/2012 | Kellam et al. |
| 2014/0112059 A1* | 4/2014 | Miao ............. H01L 45/08 365/148 |
| 2015/0016178 A1* | 1/2015 | Nardi ............. H01L 45/08 365/148 |
| 2016/0019952 A1 | 1/2016 | Ratnam |
| 2016/0019953 A1 | 1/2016 | Ratnam et al. |
| 2016/0019957 A1 | 1/2016 | Ratnam et al. |
| 2016/0019960 A1 | 1/2016 | Ratnam et al. |
| 2016/0019961 A1 | 1/2016 | Ratnam et al. |
| 2016/0019963 A1 | 1/2016 | Yan |
| 2016/0020255 A1 | 1/2016 | Ratnam et al. |
| 2016/0020389 A1 | 1/2016 | Ratnam et al. |
| 2016/0043143 A1 | 2/2016 | Sakotsubo |

OTHER PUBLICATIONS

Schrogmeier, P. et al., "Time Discrete Voltage Sensing and Iterative Programming Control for a $4F^2$ Multilevel CBRAM," 2007 Symposium on VLSI Circuits Digest of Technical Papers, pp. 186-187, (2007).

Goux, L. et al., "Evidences of Electrode-Controlled Retention Properties in Ta2O5-Based Resistive-Switching Memory Cells," ECS Solid State Letters, vol. 3, No. 11, pp. Q79-Q81, (2014).

\* cited by examiner

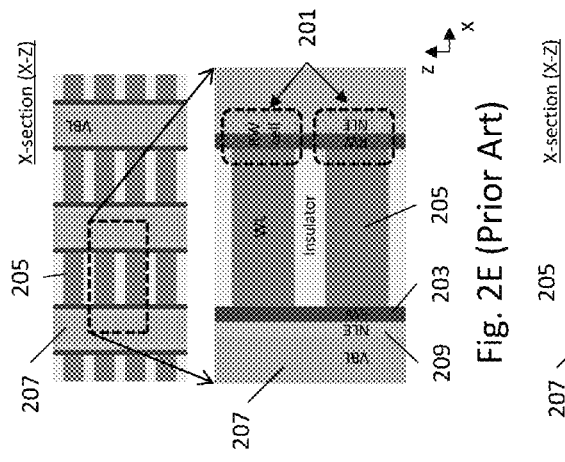
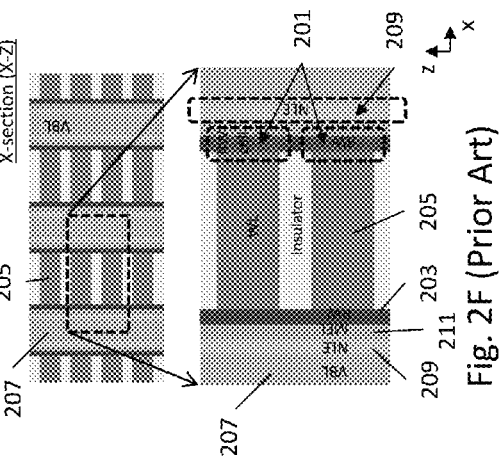
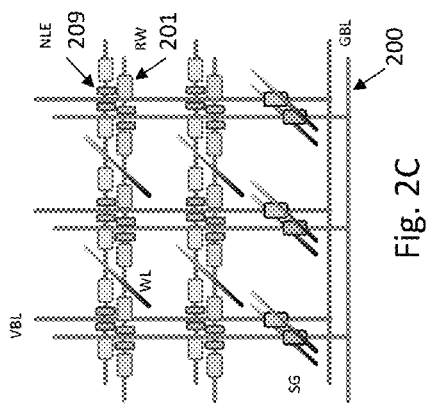
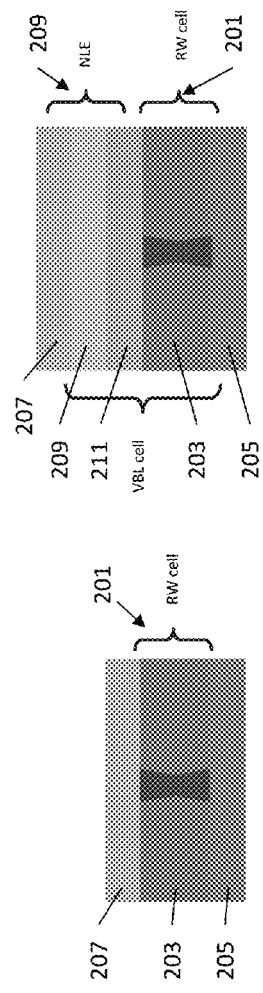
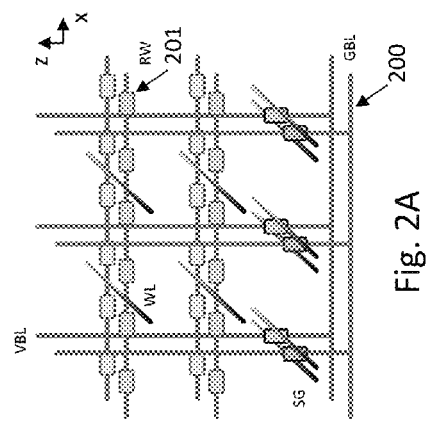

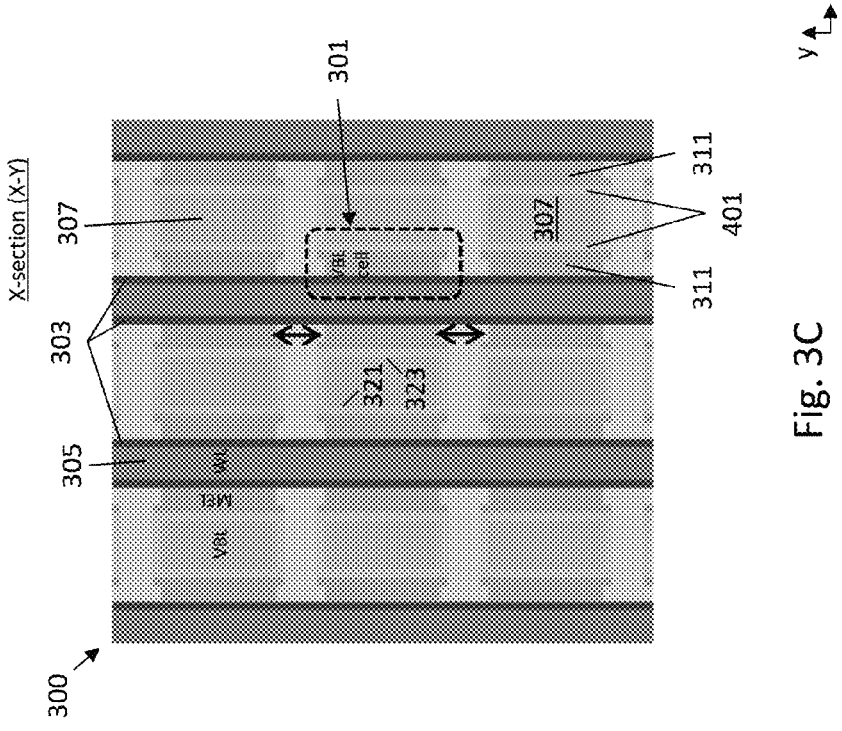
Fig. 3C
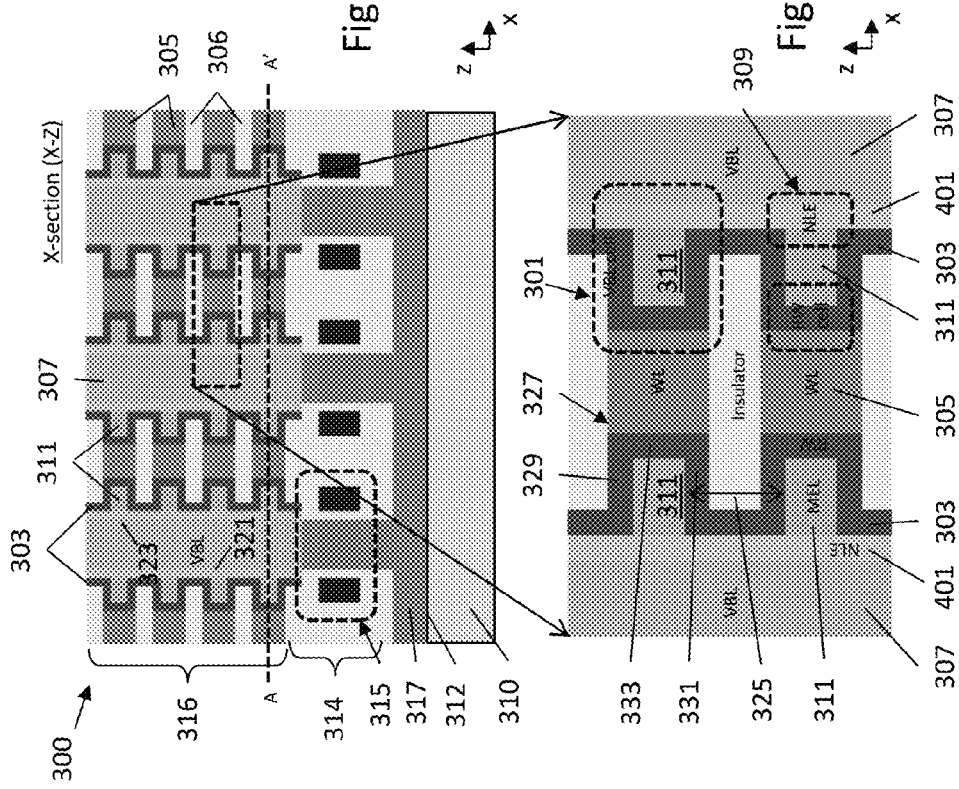
Fig. 3A
Fig. 3B

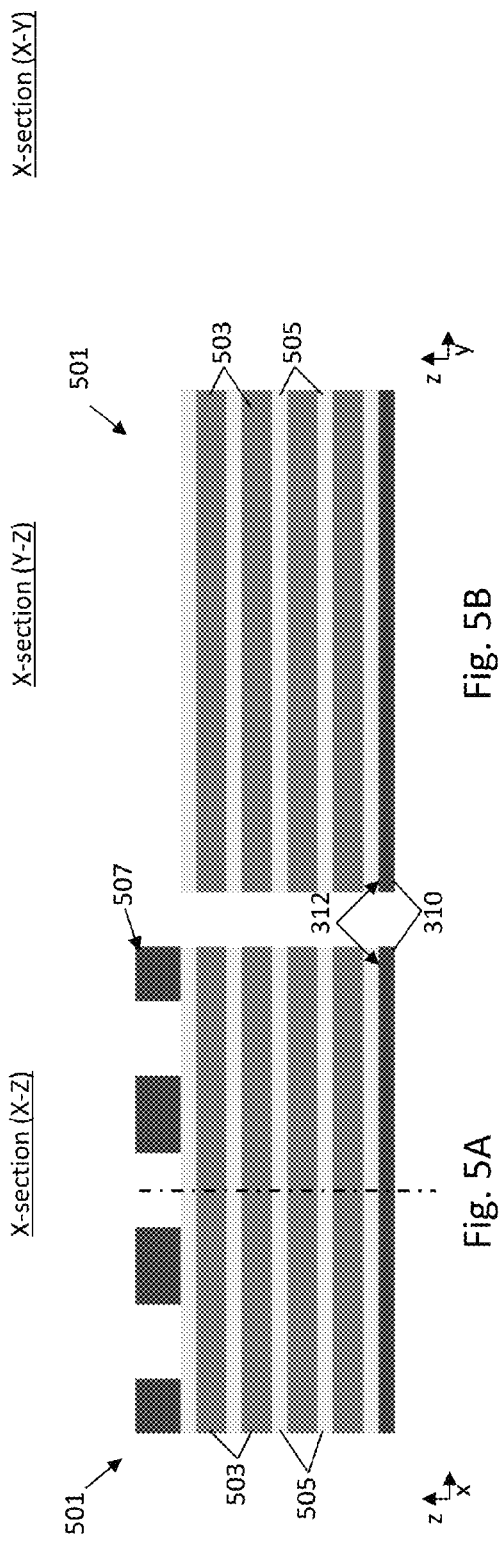
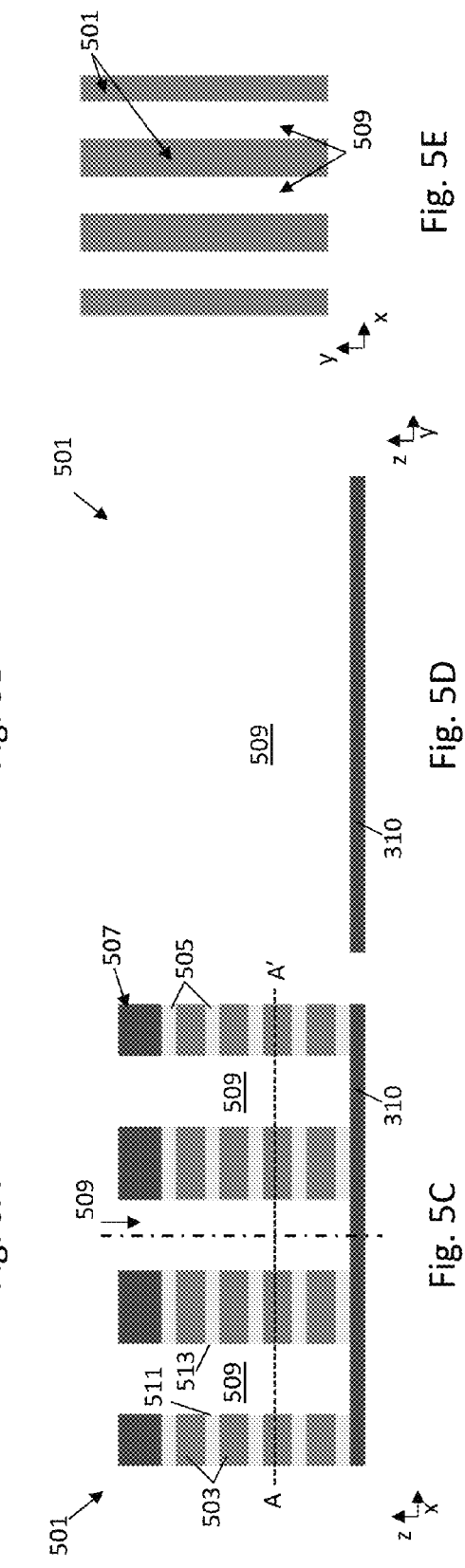

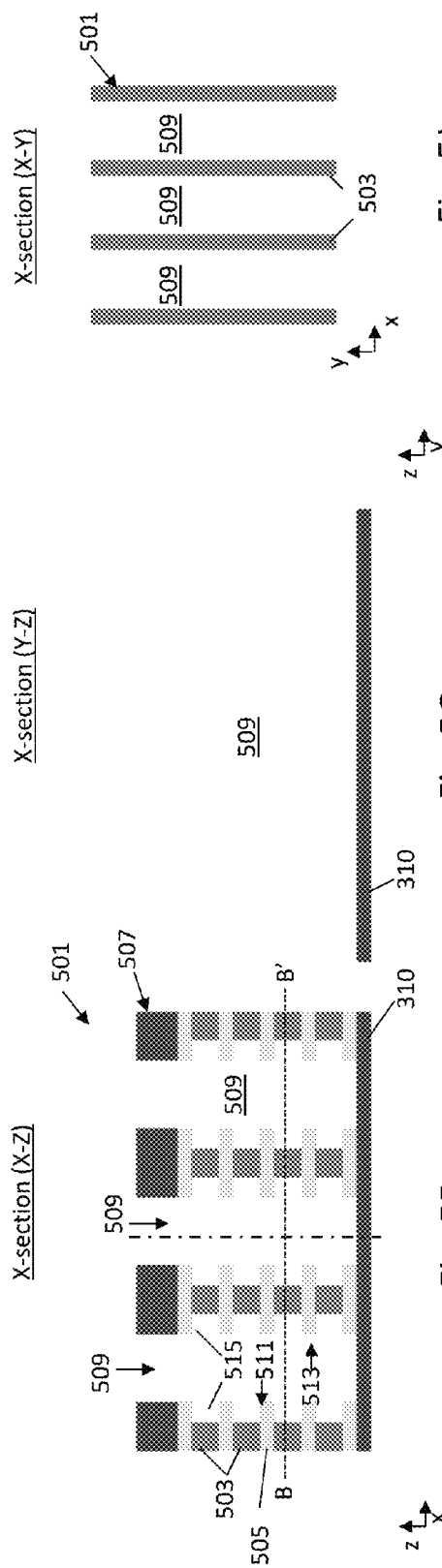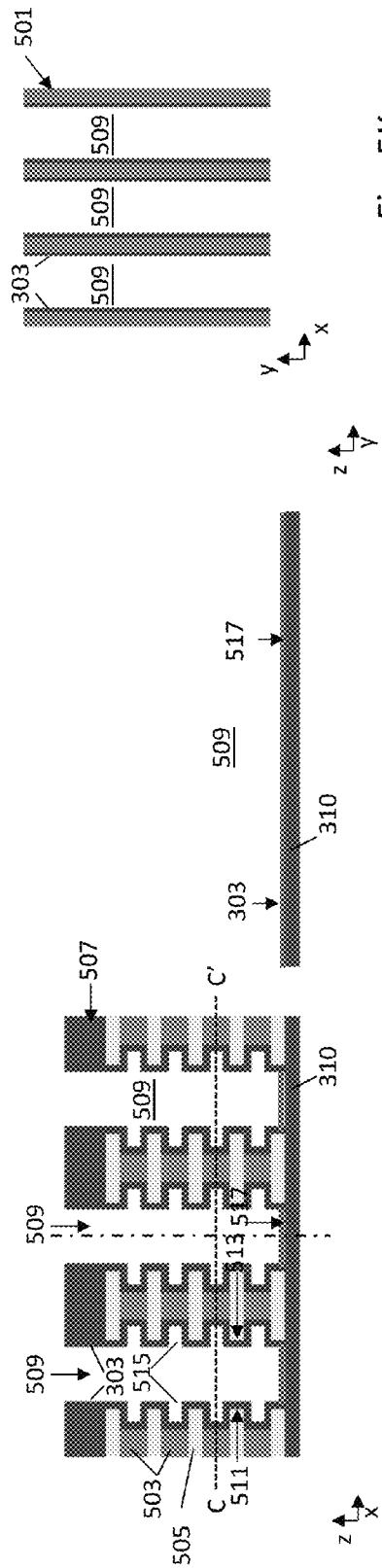

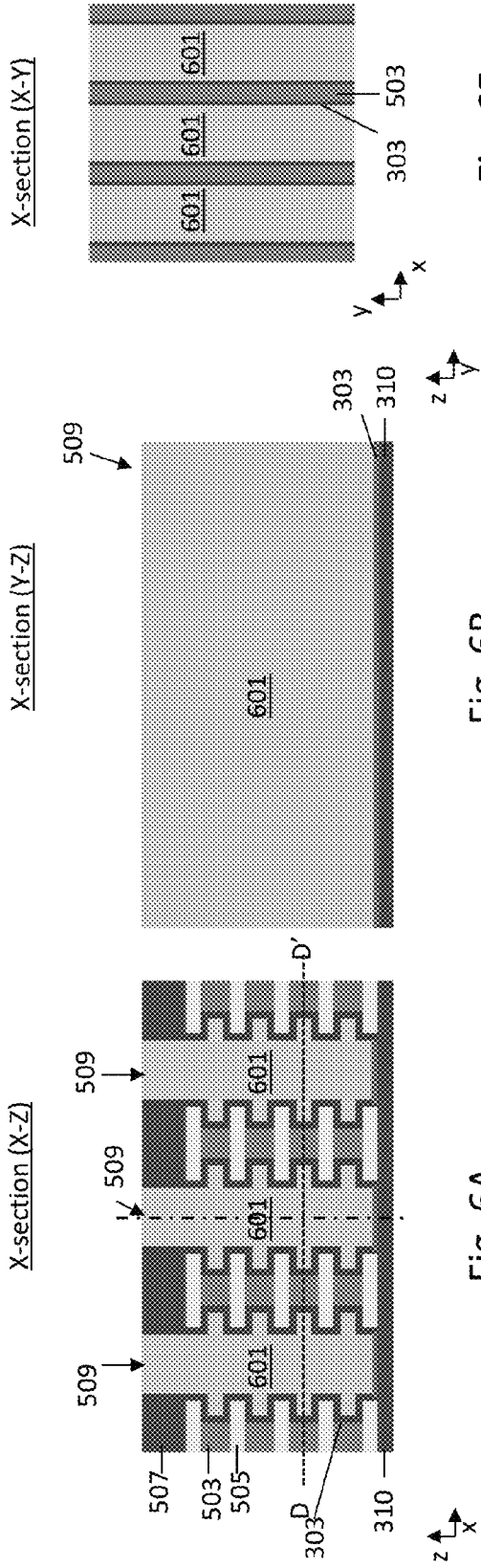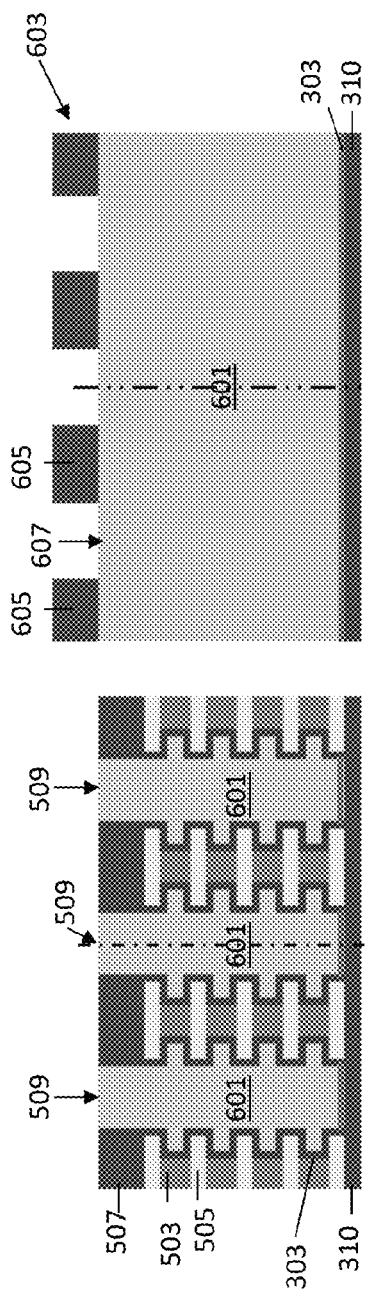

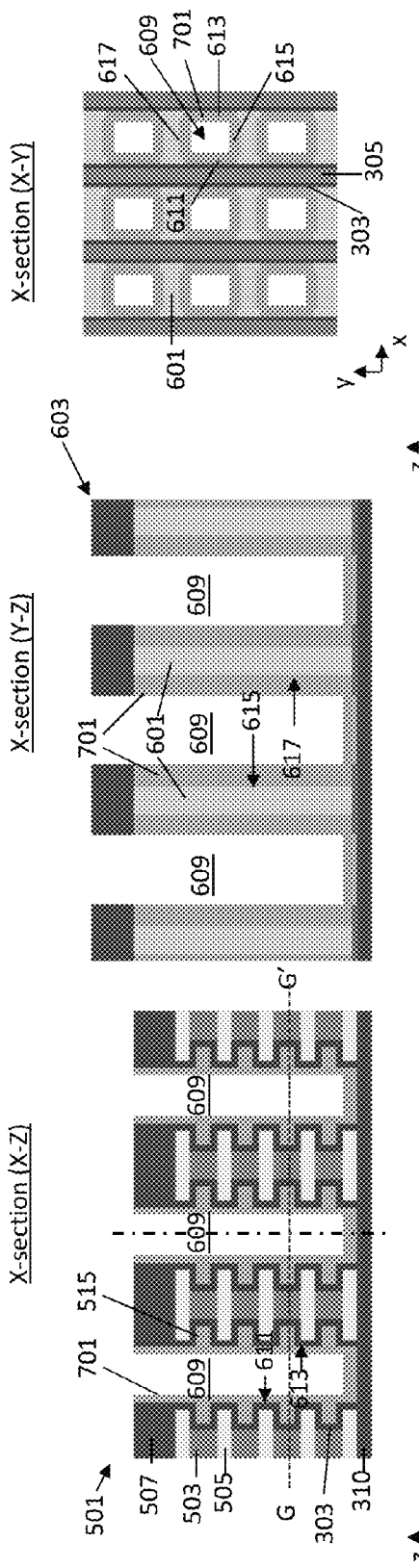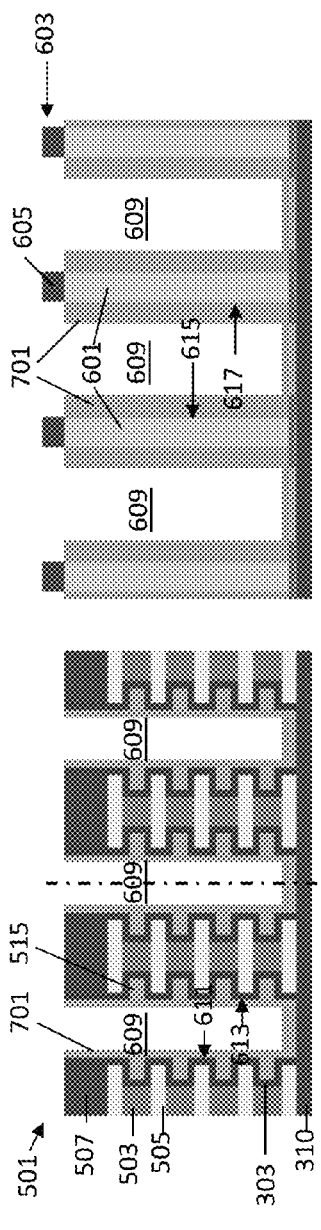
Fig. 7E
Fig. 7B
Fig. 7D
Fig. 7A
Fig. 7C

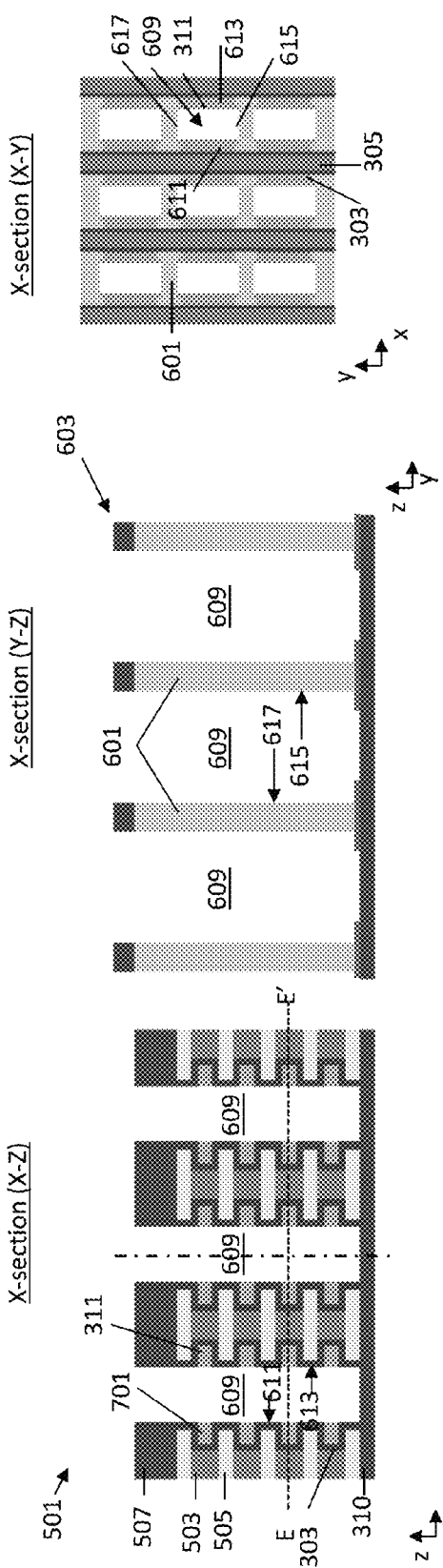
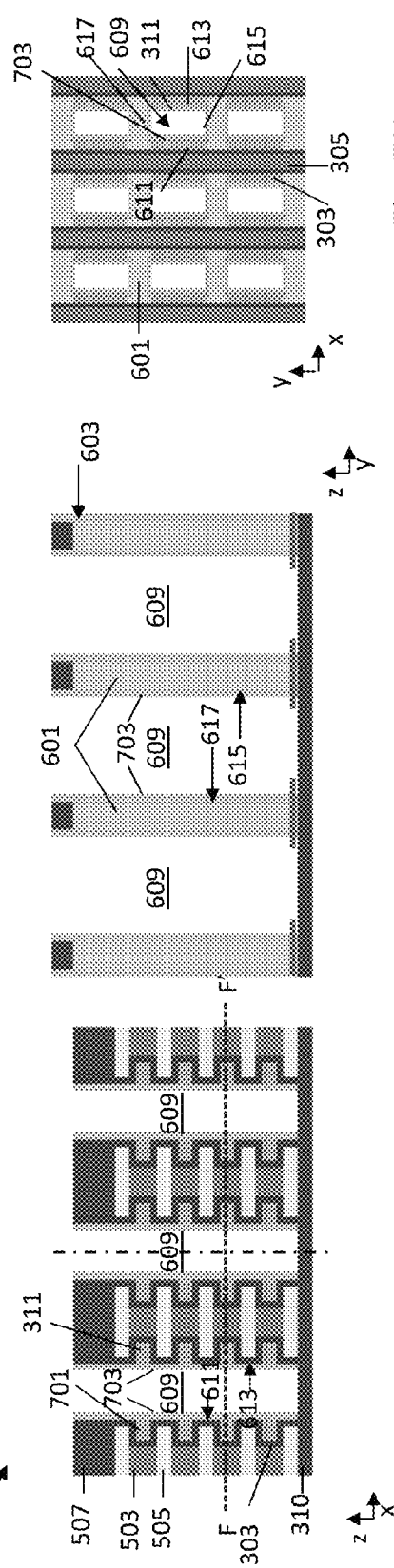
Fig. 7F, Fig. 7G, Fig. 7J, Fig. 7H, Fig. 7I, Fig. 7K

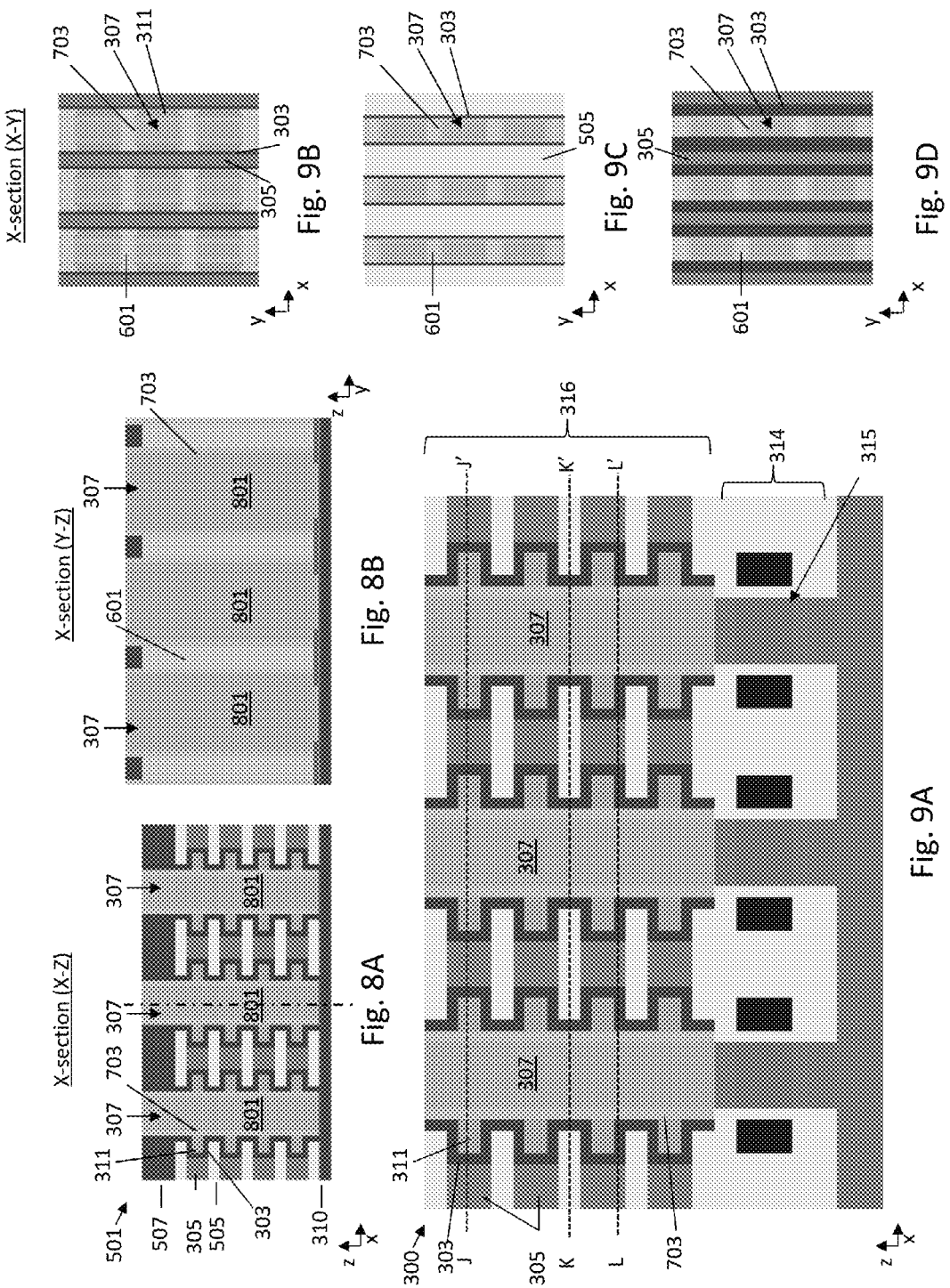

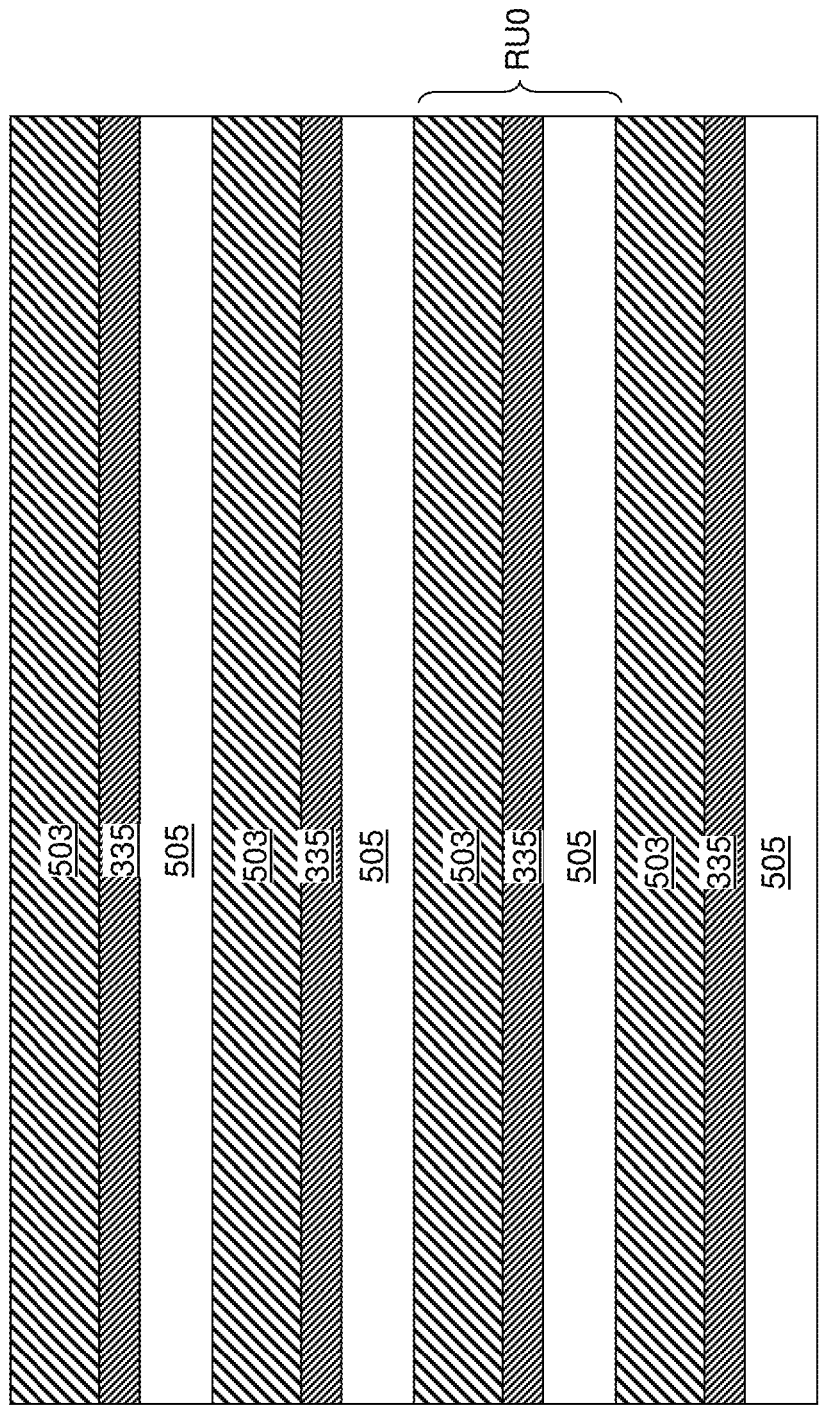

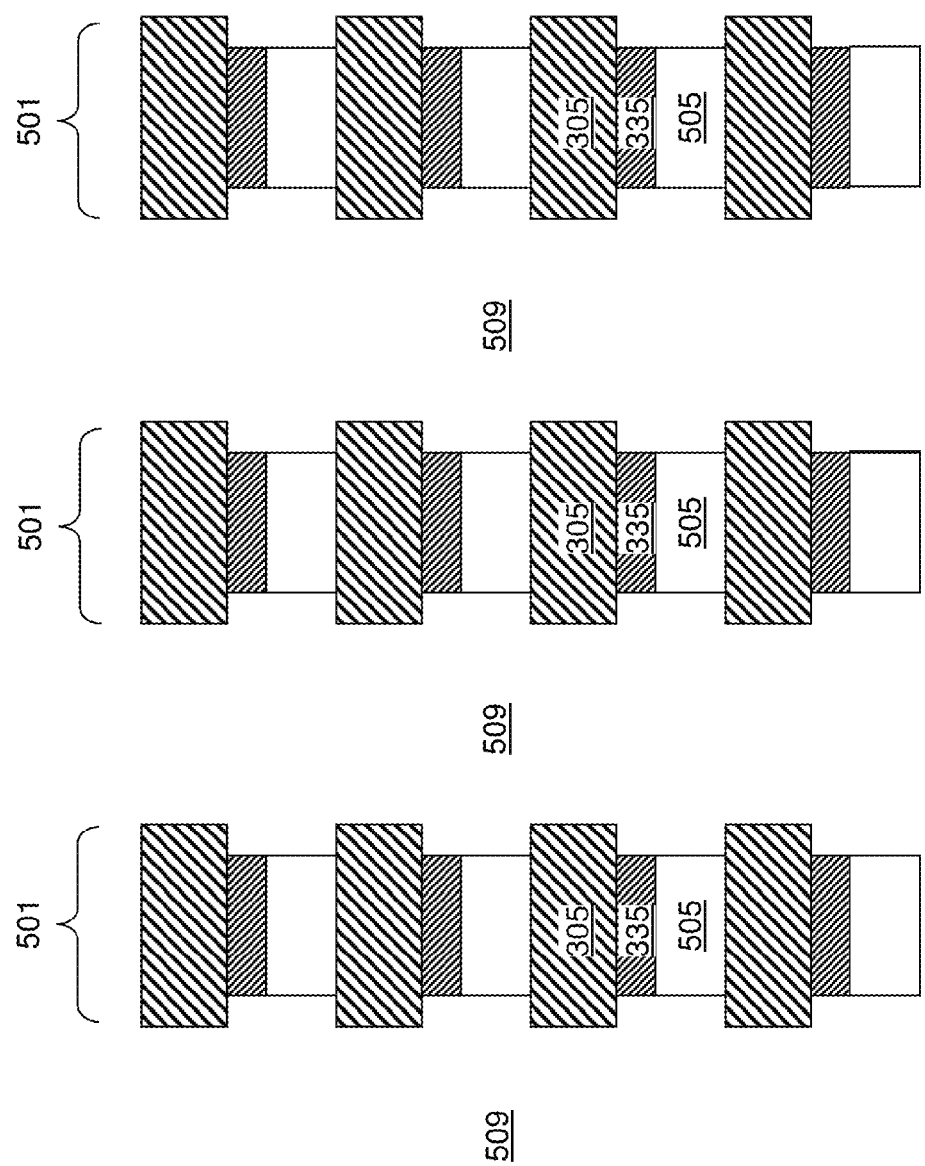

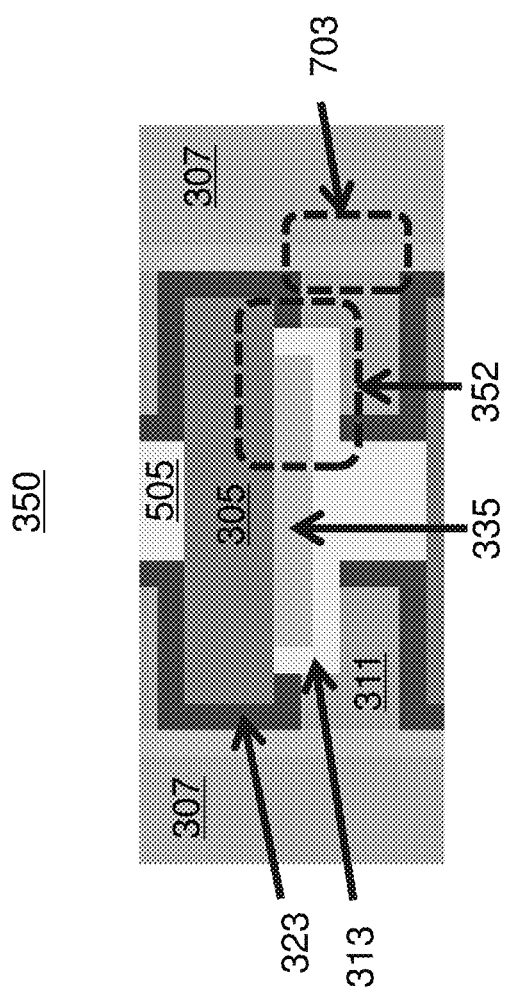

NON-VOLATILE MEMORY DEVICE CONTAINING OXYGEN-SCAVENGING MATERIAL PORTIONS AND METHOD OF MAKING THEREOF

FIELD

The present disclosure relates generally to the field of semiconductor devices and specifically to vertical restive random access memory (ReRAM) devices and other three dimensional devices and methods of making thereof.

BACKGROUND

One example of non-volatile memory uses variable resistance memory elements that may be set to either low or high resistance states, and can remain in that state until subsequently re-set to the initial condition. The variable resistance memory elements are individually connected between two orthogonally extending conductors (typically bit and word lines) where they cross each other in a two-dimensional array. The state of such a memory element is typically changed by proper voltages being placed on the intersecting conductors. An example of an array of variable resistive elements and associated diodes is given in U.S. Patent Application Publication No. US 2009/0001344, which is incorporated by reference herein in its entirety.

SUMMARY

According to an aspect of the present disclosure, a monolithic three-dimensional memory device is provided, which comprises a repeating stack of instances of a repetition unit comprising an insulating layer, a oxygen-scavenging material portion, an electrically conductive word line. The repeating stack is located over a substrate, and the oxygen-scavenging material portion comprises a material having a greater affinity to oxygen than a material of the electrically conductive word line. The monolithic three-dimensional memory device comprises at least one non-volatile memory element layer including oxygen-scavenged non-volatile memory element portions and non-scavenged non-volatile memory element portions. The device may further comprise at least one bit line extending along a direction of repetition in the repeating stack, and at least one non-linear element material layer located between the at least one bit line and the at least one non-volatile memory element layer.

The at least one non-linear element material layer may be located on the at least one non-volatile memory element layer, and the at least one bit line may contact the at least one non-linear element material layer. A material composition of the oxygen-scavenged non-volatile memory element portions may differ from a composition of the non-scavenged non-volatile memory element portions by a lower atomic oxygen concentration.

According to yet another aspect of the present disclosure, a method of forming a monolithic three-dimensional memory device is provided. The method includes the steps of: forming an initial repeating stack of instances of a repetition unit comprising an insulating layer, a oxygen-scavenging material layer, and an electrically conductive layer over a substrate, wherein the oxygen-scavenging material layer comprises a material having a greater affinity to oxygen than a material of the electrically conductive layer; patterning the initial repeating stack to form a repeating stack of instances of a repetition unit comprising an insulating layer, a oxygen-scavenging material portion, an electrically conductive word line; forming lateral recesses at least by recessing sidewalls of the oxygen-scavenging material portions with respect to sidewalls of the electrically conductive word lines; forming at least one non-volatile memory element layer on the sidewalls of the electrically conductive word lines and the recessed sidewalls of the oxygen-scavenging material portions; forming middle electrodes in the lateral recesses and on the at least one non-volatile memory element layer; and forming at least one bit line extending along a direction of repetition in the repeating stack over the at least one non-volatile memory element layer.

BRIEF DESCRIPTION OF THE DRAWINGS

FIG. 2A schematically illustrates the electrical connections within a memory array of a ReRAM memory device.

FIG. 2B is an enlarged partial cross-section view of a memory cell of the device of FIG. 2A.

FIG. 2C schematically illustrates a ReRAM memory device having a non-linear element (NLE) connected in series with each memory cell.

FIG. 2D is an enlarged partial cross-section view of a memory cell and NLE of the device of FIG. 2C.

FIG. 2E is an enlarged partial cross-section view of a prior art ReRAM memory device illustrating a non-linear element (NLE) located between a non-volatile memory element material and a vertical bit line.

FIG. 2F is an enlarged partial cross-section view of a prior art ReRAM memory device illustrating a continuous middle electrode layer (MEL) located between a non-volatile memory element material and a non-linear element (NLE).

FIG. 3A is a cross-section view of a ReRAM memory device illustrating a plurality of discrete, isolated middle electrode layers (MELs) located between a non-volatile memory element material and a non-linear element (NLE) according to an embodiment.

FIG. 3B is an enlarged cross-section view of a portion of the ReRAM memory device of FIG. 3A.

FIG. 3C is a top view of the ReRAM memory device of FIG. 3A.

FIGS. 5A-5K are side (FIGS. 5A-5D and 5F-5I) and top (FIGS. 5E, 5J and 5K) cross-section views showing process steps for fabricating a ReRAM memory device according to an embodiment.

FIGS. 6A-6E are side (FIGS. 6A-6D) and top (FIG. 6E) cross-section views showing additional process steps for fabricating a ReRAM memory device according to an embodiment.

FIGS. 7A-7K are side (FIGS. 7A-7D and 7F-7I) and top (FIGS. 7E, 7J and 7K) cross-section views showing additional process steps for fabricating a ReRAM memory device according to an embodiment.

FIGS. 8A and 8B are side cross-section views showing additional process steps for fabricating a ReRAM memory device according to an embodiment.

FIG. 9A is a side cross-section view of a ReRAM memory device fabricated in accordance with the process steps of FIGS. 5A-8B.

9B-9D are top cross-section views of the ReRAM memory device of FIG. 9A.

FIGS. 10A-10J are vertical sequential cross-sectional views of an array region of an exemplary ReRAM memory device according to an embodiment of the present disclosure.

Figure 10B:
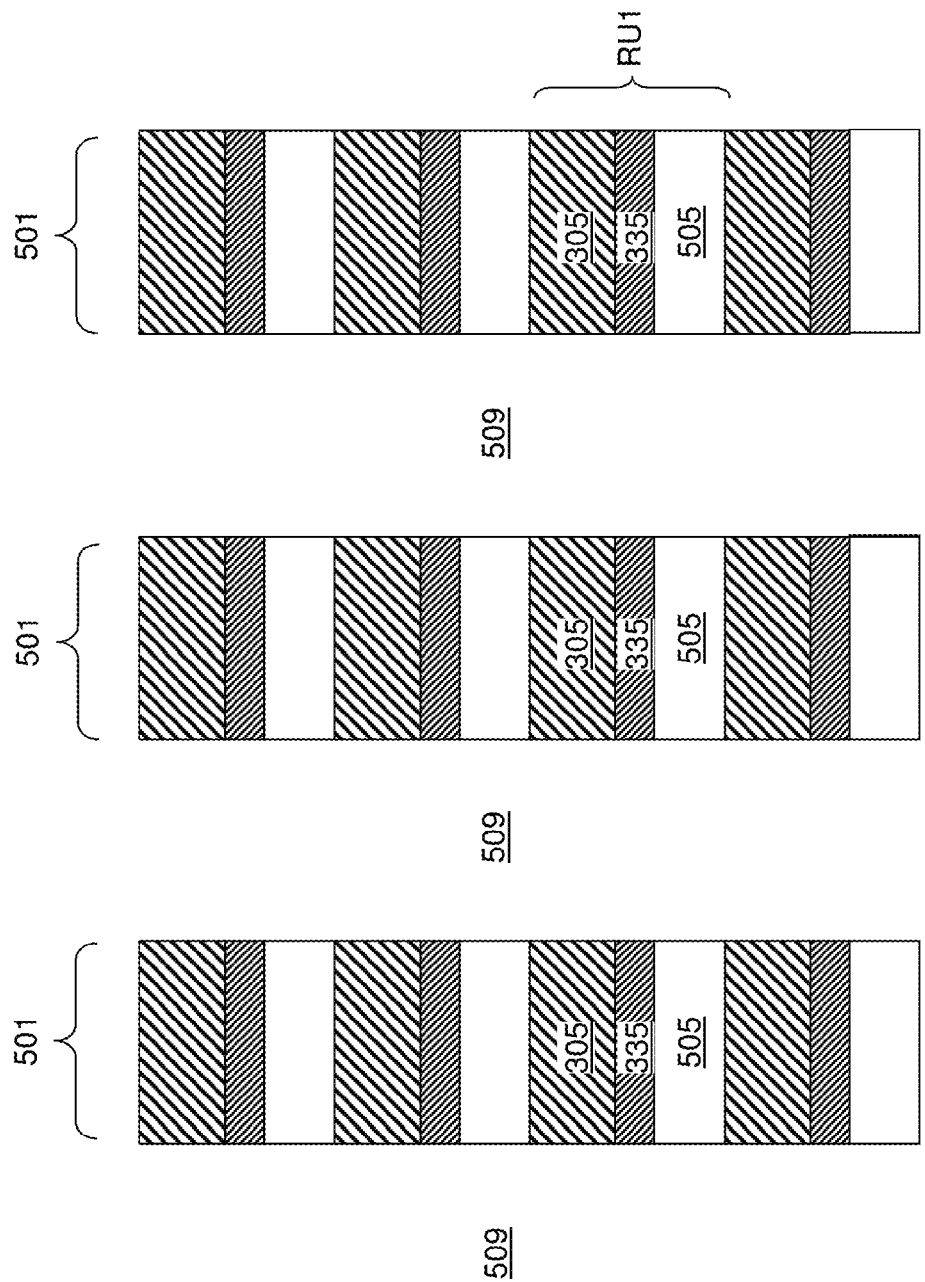
Figure 10D:
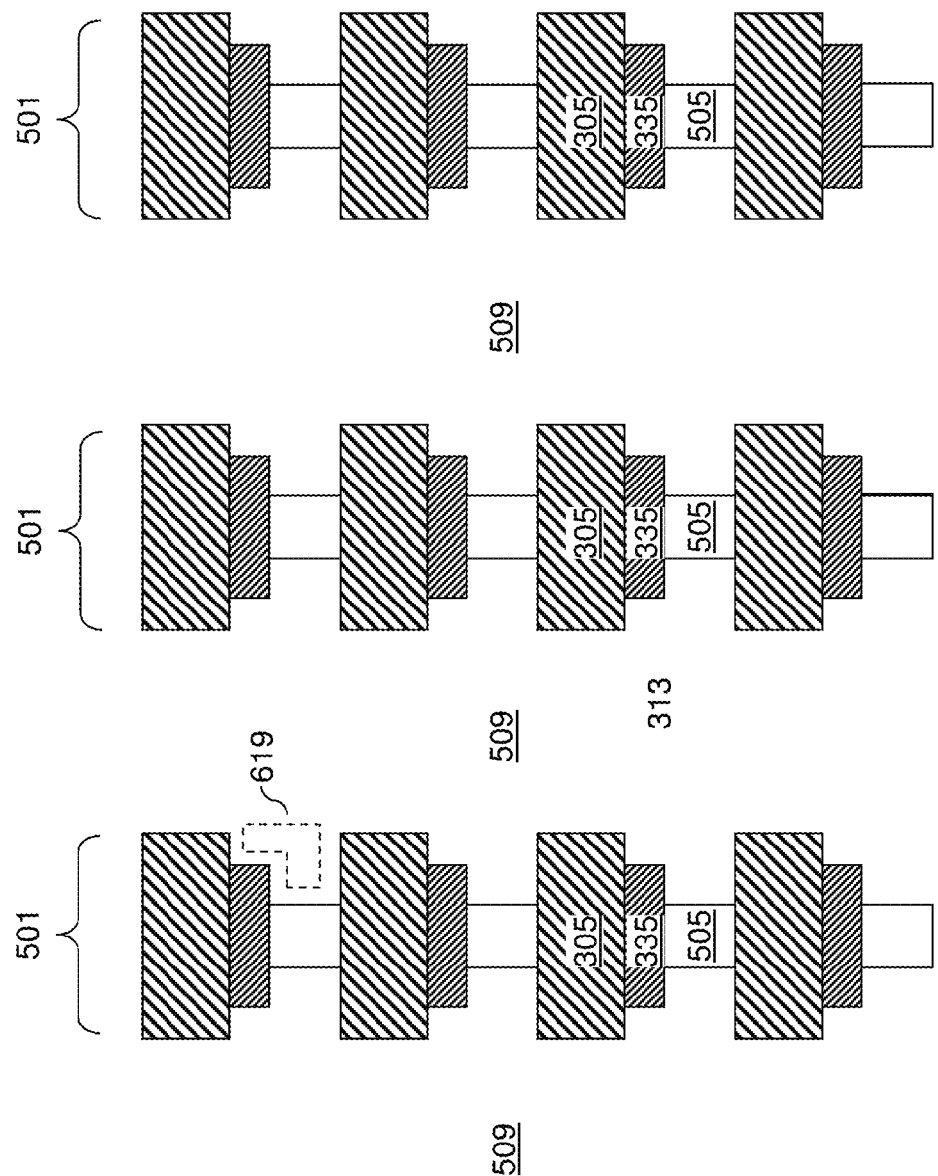
Figure 10E:
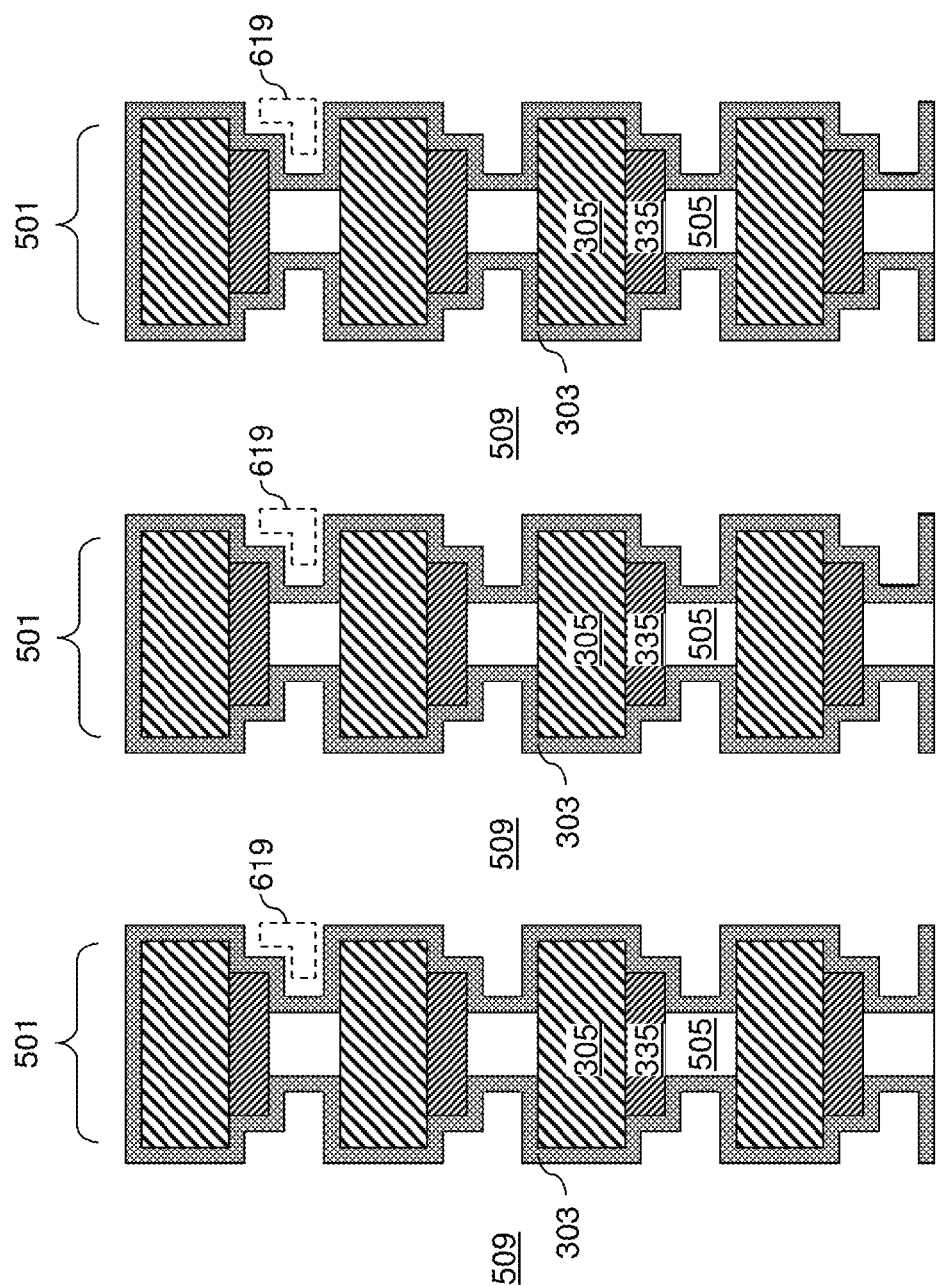
Figure 10F:
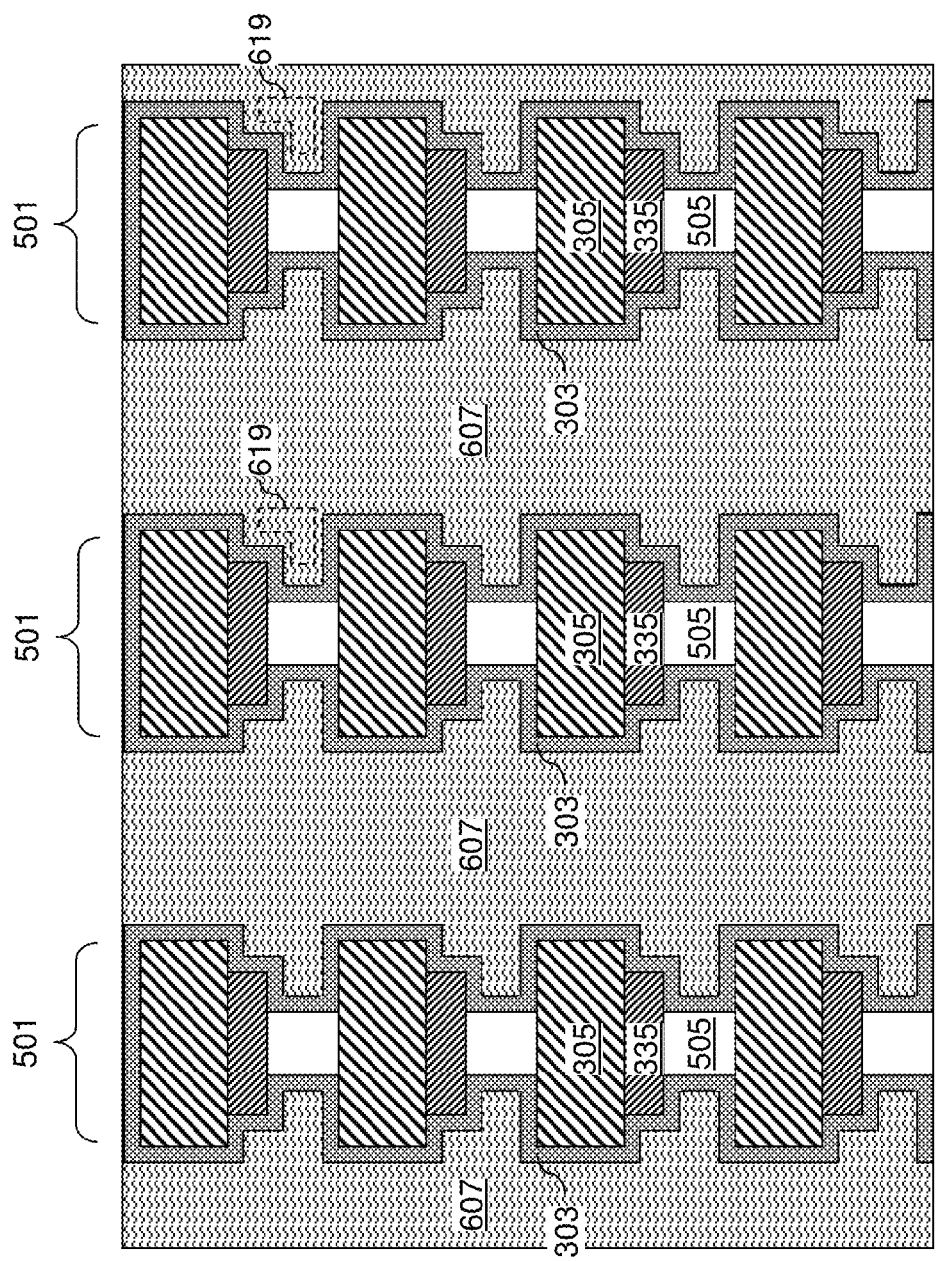
Figure 10G:
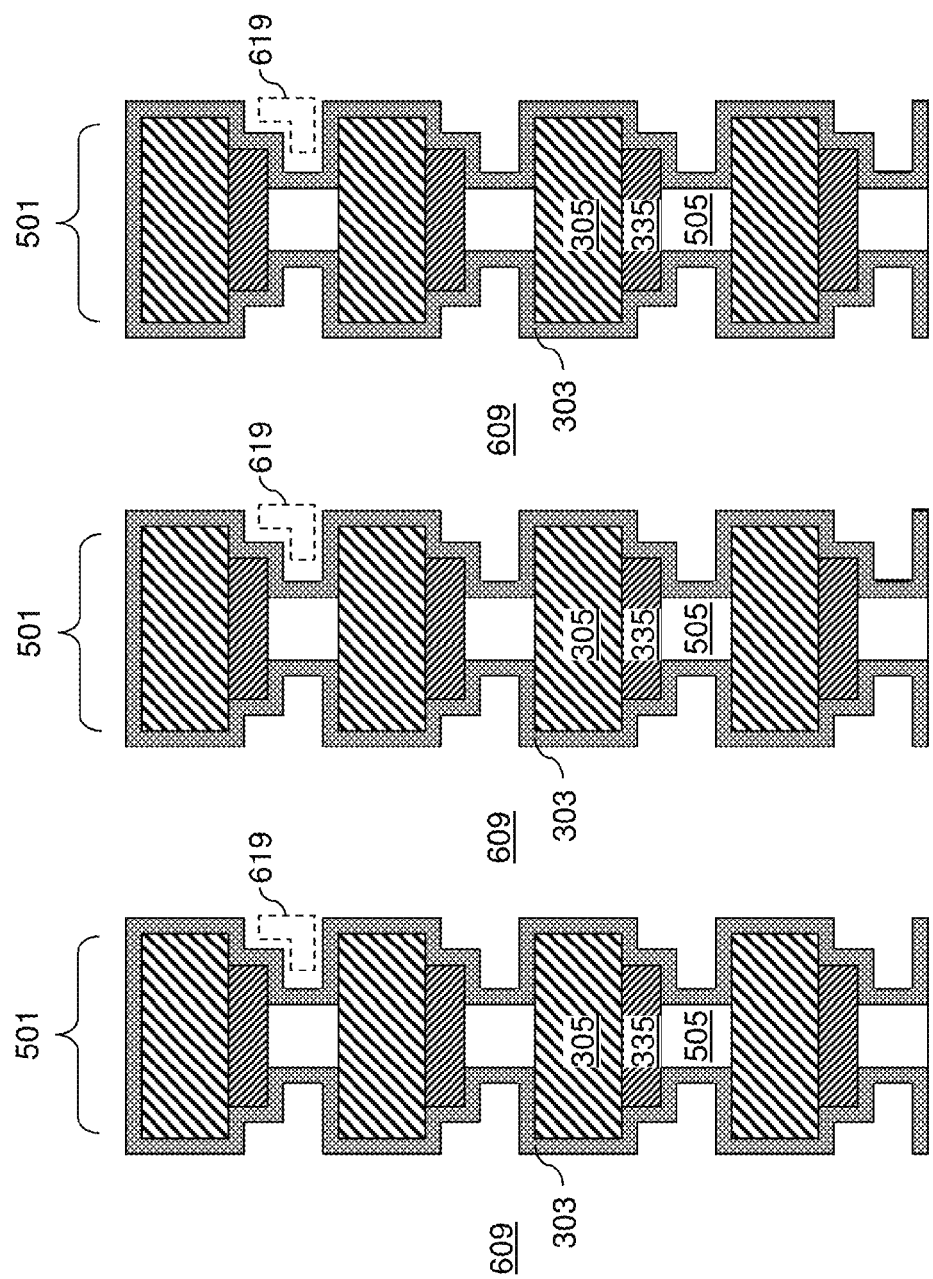
Figure 10H:
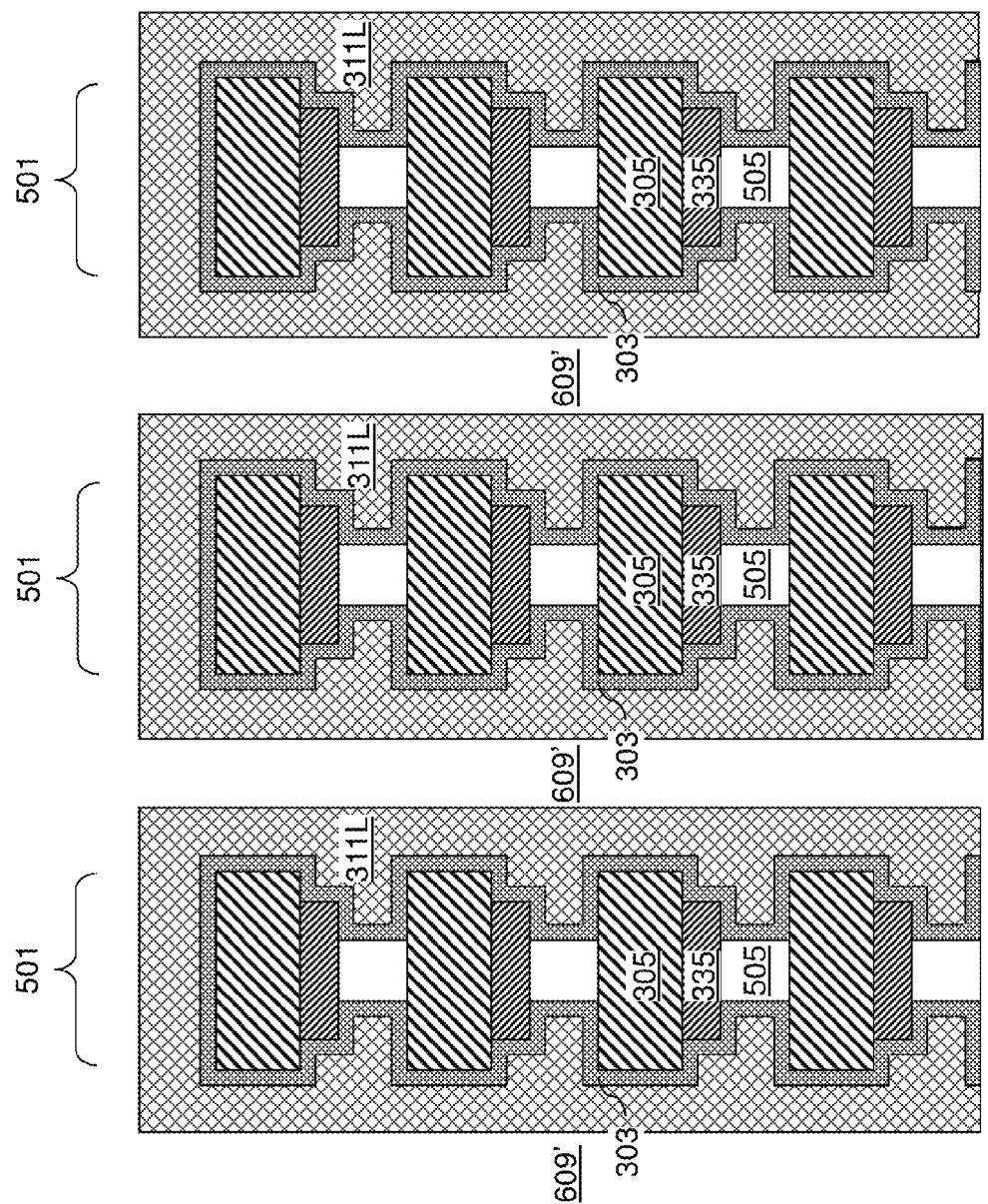
Figure 10I:
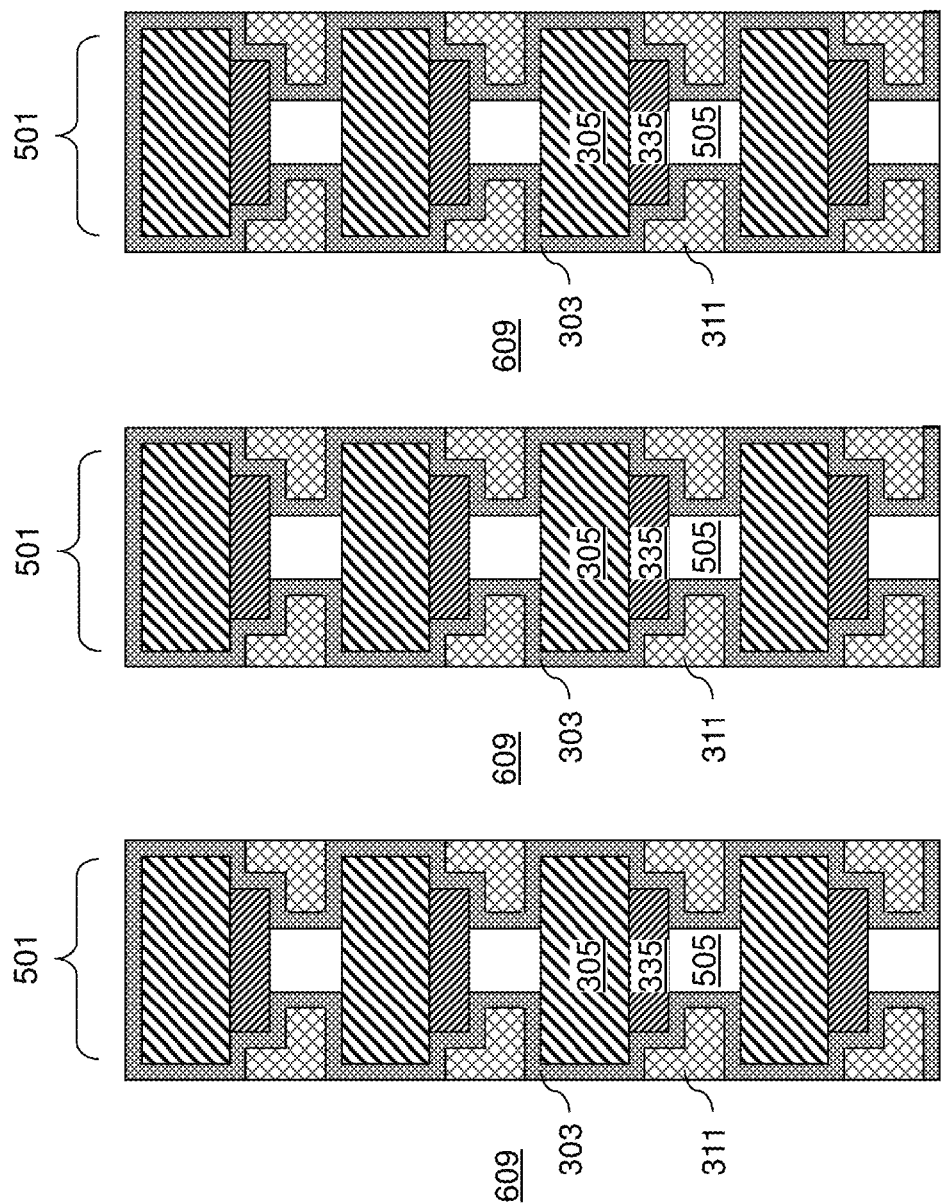
Figure 10J:
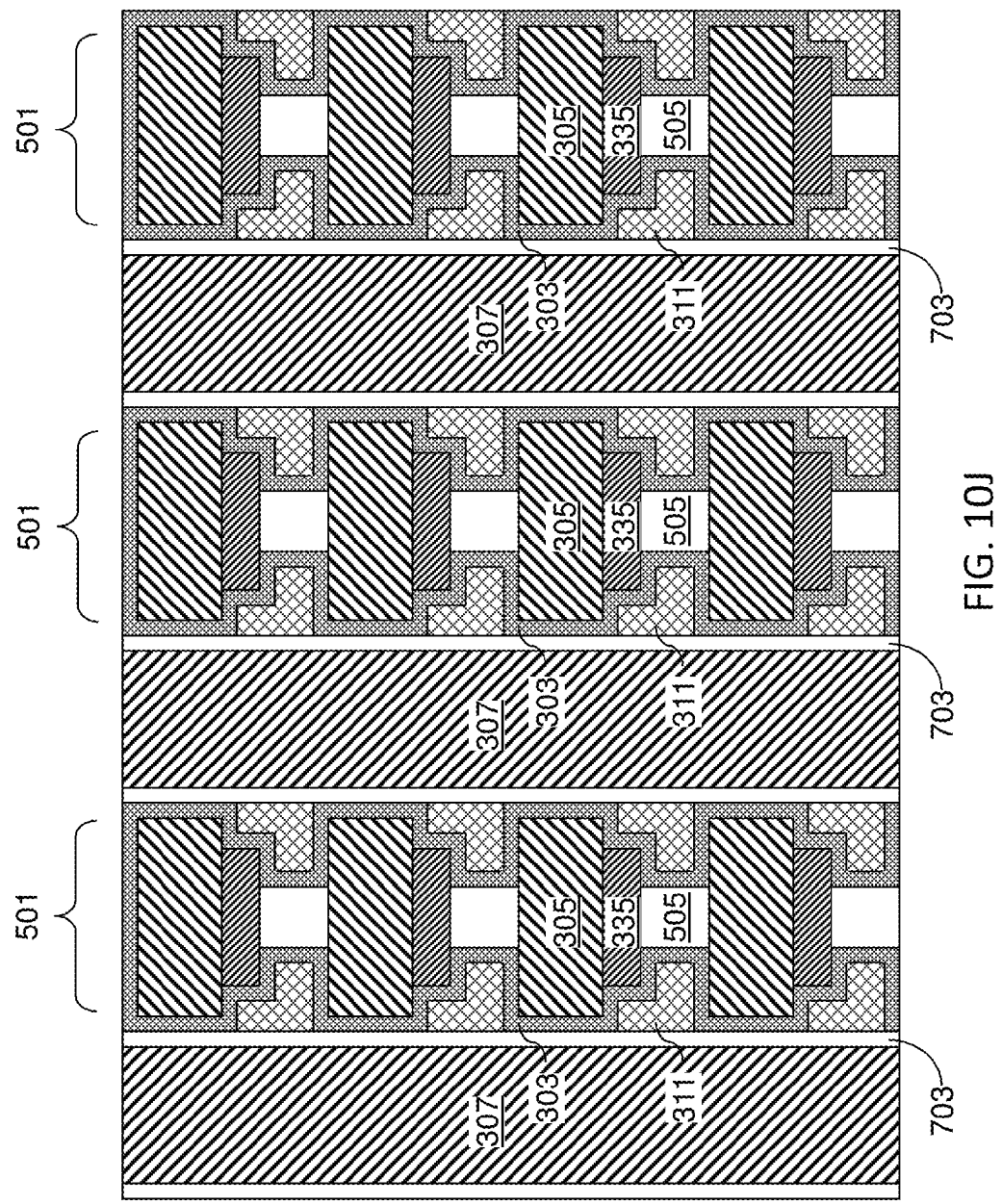
Figure 11A:
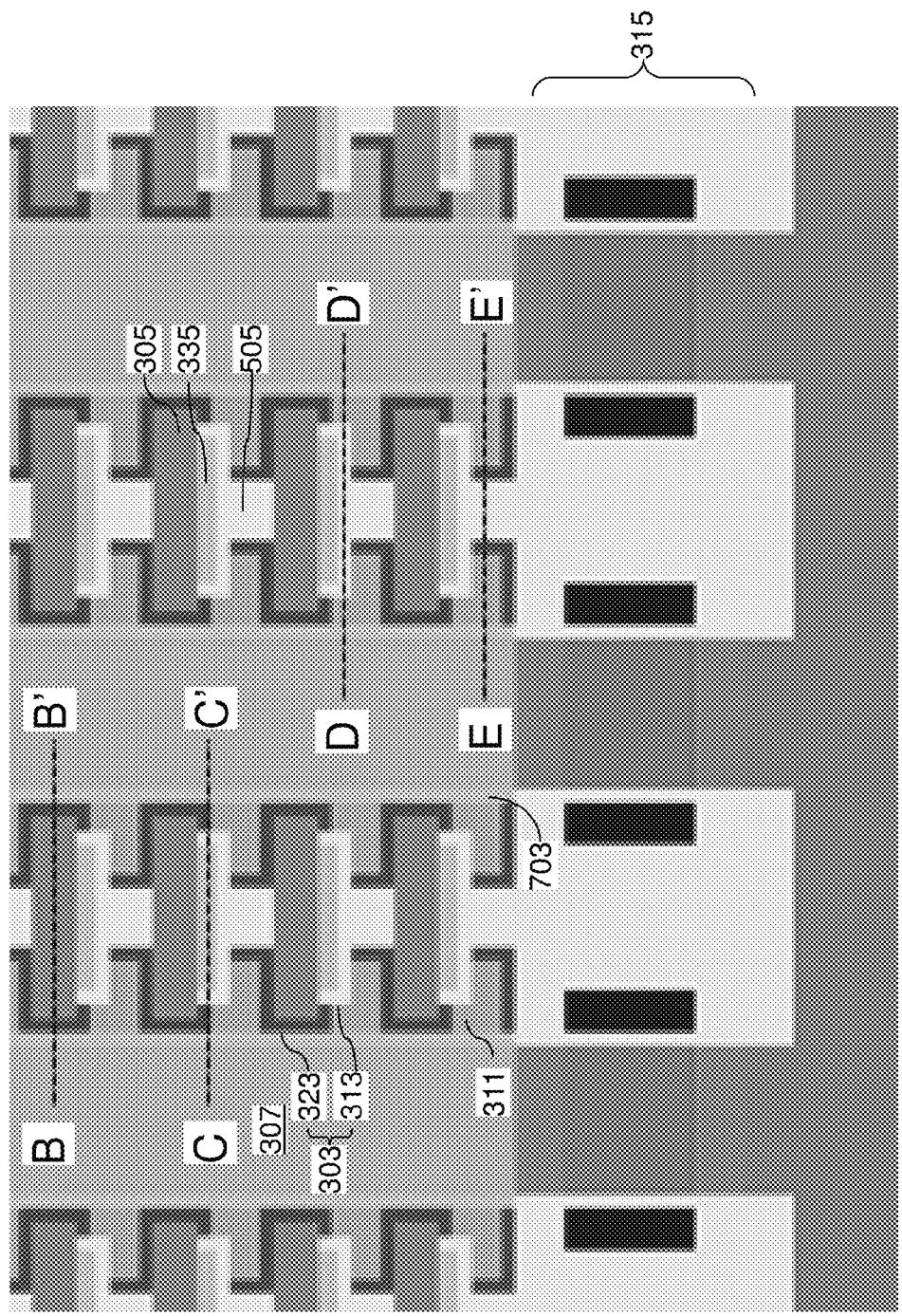

FIG. 11A is a vertical cross-sectional view of the exemplary ReRAM memory device of FIG. 10J after replacement of sacrificial material portions with insulator material portions according to an embodiment of the present disclosure.

FIGS. 11B-11E are various horizontal cross-sectional views of the exemplary ReRAM memory device of FIG. 11A. FIG. 11F is a close up vertical cross-sectional view of one memory cell of the device of FIG. 11A.

FIGS. 12A-12F are alternative embodiments of the exemplary ReRAM memory device.

DETAILED DESCRIPTION

Embodiments of the present disclosure will be described below with reference to the accompanying drawings. It should be understood that the following description is intended to describe exemplary embodiments of the disclosure, and not to limit the disclosure.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Embodiments of the disclosure provide a monolithic, three dimensional array of memory devices, such as an array of ReRAM devices. The memory cells of such devices may be vertically oriented, such that at least one memory cell is located over another memory cell. The array allows vertical scaling of the devices to provide a higher density of memory cells per unit area of silicon or other semiconductor material.

Figure 1:
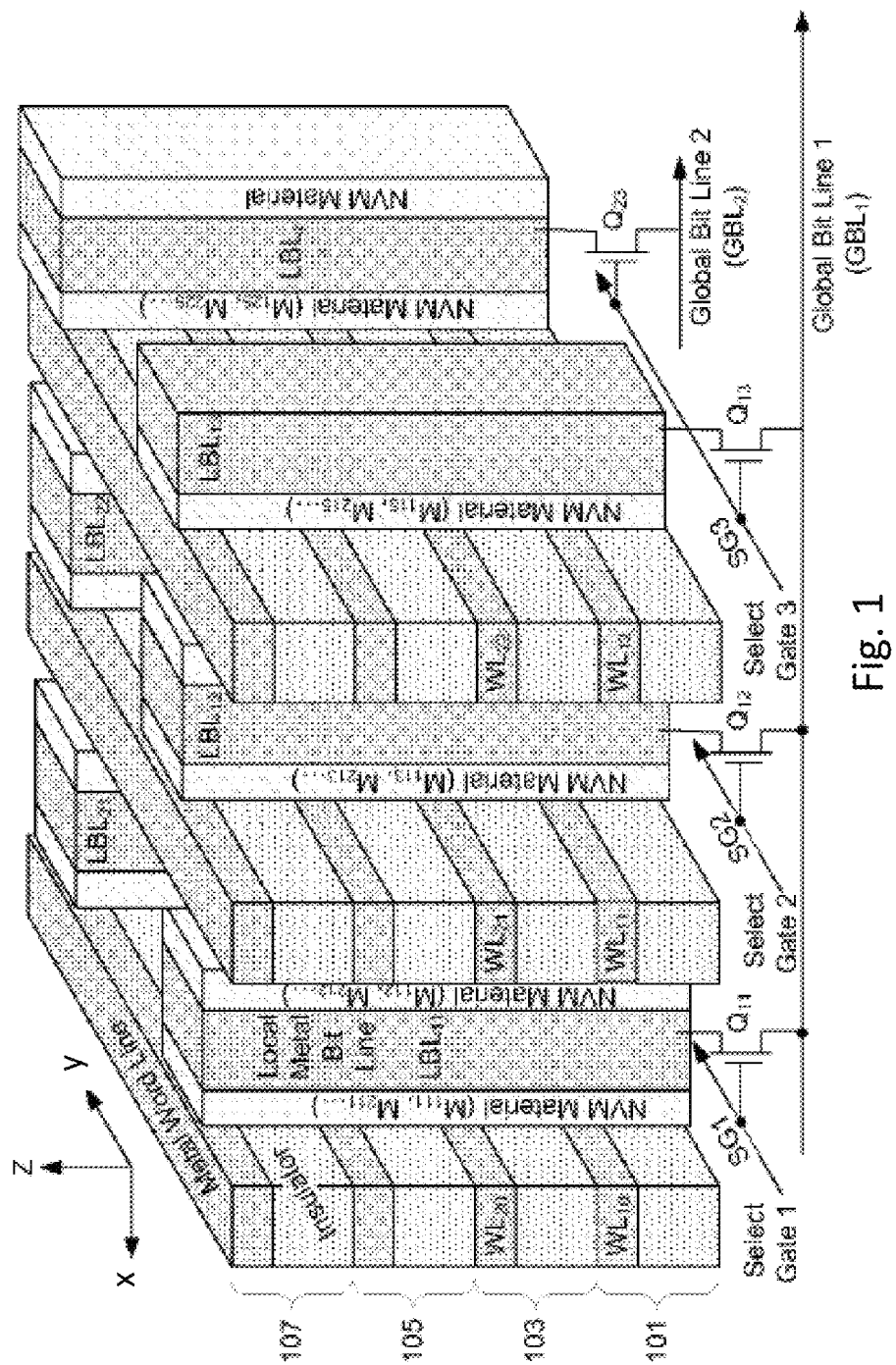
FIG. 1 shows a perspective view of a three dimensional ReRAM memory device.

FIG. 1 shows one example semiconductor structure for implementing a vertically oriented 3D ReRAM memory element (also known as storage class memory, "SCM"), of the type described in U.S. Pat. Pub. No. 2012/0147648, published Jun. 14, 2012 and incorporated by reference herein in its entirety. The ReRAM device is configured for use of non-volatile memory element ("NVM") material that is non-conductive when first deposited. Since the material is initially non-conductive, there is no necessity to isolate the memory elements at the cross-points of the word and bit lines from each other. Several memory elements may be implemented by a single continuous layer of material, which in the case of FIG. 1 are strips of NVM material oriented vertically along opposite sides of the vertical bit lines in the x-direction and extending upwards through all the planes in the z-direction. A significant advantage of the structure of FIG. 1 is that all word lines and strips of insulation under them in a group of planes may be defined simultaneously by use of a single mask, thus greatly simplifying the manufacturing process.

Referring to FIG. 1, a small part of four planes (e.g., device levels separated in the z-direction) 101, 103, 105 and 107 of the three-dimensional array are shown. All of the planes have the same horizontal pattern of conductive, insulating and NVM materials. In each plane, electrically conductive (e.g., metal) word lines ($WL_{zx}$) are elongated in the y-direction and spaced apart in the x-direction. Each plane includes a layer of insulating material (e.g., a dielectric) that isolates its word lines from the word lines of the plane below it or, in the case of plane 101, of the substrate circuit components below it. In some embodiments, the word lines $WL_{zx}$ for a fixed value of x form a stack of alternating layers that may extend beyond the memory device into a contact area (not shown).

Extending through each plane is a collection of electrically conductive (e.g., metal) local bit line (LBL) "pillars" elongated in the vertical z-direction and forming a regular array in the x-y planes.

Each bit line pillar is connected to one of a set of underlying global bit lines (GBL) (e.g., located in the silicon substrate) running in the x-direction at the same pitch as the pillar spacing through the select devices ($Q_{yx}$) formed in the substrate whose gates are driven by the row select lines (SG) elongated in the y-direction, which are also formed in the substrate. The select devices $Q_{yx}$ may be vertically oriented field effect transistors. Examples of suitable transistors for the select devices $Q_{yx}$ are described, for example, in U.S. patent application Ser. No. 14/206,196, filed Mar. 12, 2014, which is incorporated by reference herein in its entirety. Also fabricated in the substrate but not shown in FIG. 1 are sense amplifiers, input-output (I/O) circuitry, control circuitry, and any other necessary peripheral circuitry. There is one row select line (SG) for each row of local bit line pillars in the y-direction and one select device (Q) for each individual local bit line (LBL).

Each vertical strip of NVM material is sandwiched between the vertical local bit lines (LBL) and a plurality of word lines (WL) vertically stacked in all the planes. Preferably the NVM material is present between the local bit lines (LBL) in the y-direction. A memory storage element (M) is located at each intersection of a word line (WL) and a local bit line (LBL). In the case of a metal oxide (e.g., nickel oxide or copper oxide) for the memory storage element material, a small region of the NVM material between an intersecting local bit line (LBL) and word line (WL) is controllably alternated between more conductive (set) and less conductive (reset) states by appropriate voltages applied to the intersecting lines.

The material used for the non-volatile memory elements M in the array of FIG. 1 can be a metal oxide, a carbon material, a chalcogenide, or any one of a number of materials that exhibit a stable, reversible shift in resistance in response to an external voltage applied to or current passed through the material.

Metal oxides are characterized by being insulating when initially deposited. One suitable metal oxide is a titanium oxide MOO in which near-stoichiometric $TiO_2$ bulk material is altered in an annealing process to create an oxygen deficient layer (or a layer with oxygen vacancies) in proximity of the bottom electrode. The top platinum electrode for memory storage element comprising $TiO_x$, with its high work function, creates a high potential $Pt/TiO_2$ barrier for electrons. As a result, at moderate voltages (below one volt), a very low current will flow through the structure. The bottom $Pt/TiO_{2-x}$ barrier is lowered by the presence of the oxygen vacancies ($O^+_2$) and behaves as a low resistance contact (ohmic contact). (The oxygen vacancies in $TiO_2$ are known to act as n-type dopant, transforming the insulating oxide in an electrically conductive doped semiconductor.) The resulting composite structure is in a non-conductive (high resistance) state.

But when a large negative voltage (such as 1.5 volt) is applied across the structure the oxygen vacancies drift toward the top electrode and, as a result, the potential barrier $Pt/TiO_2$ is reduced and a relatively high current can flow through the structure. The device is then in its low resistance (conductive) state. Experiments reported by others have shown that conduction is occurring in filament-like regions of the $TiO_2$, perhaps along grain boundaries.

The conductive path is broken by applying a large positive voltage across the structure. Under this positive bias, the oxygen vacancies move away from the proximity of the top $Pt/TiO_2$ barrier, and "break" the filament. The device returns to its high resistance state. Both of the conductive and non-conductive states are non-volatile. Sensing the conduction of the memory storage element by applying a voltage around 0.5 volts can easily determine the state of the memory element.

While this specific conduction mechanism may not apply to all metal oxides, as a group, they have a similar behavior, transition from a low conductive state to a high conductive occurs state when appropriate voltages are applied, and the two states are non-volatile. Examples of other materials that can be used for the non-volatile memory elements $M_{zxy}$ in the array of FIG. 1 include $HfO_x$, $ZrO_x$, $WO_x$, $NiO_x$, $CoO_x$, $CoAlO_x$, $MnO_x$, $ZnMn_2O_4$, $ZnO_x$, $TaO_x$, $NbO_x$, $HfSiO_x$, $HfAlO_x$. Suitable top electrodes include metals with a high work function (typically >4.5 eV) capable to getter oxygen in contact with the metal oxide to create oxygen vacancies at the contact. Some examples are TaCN, TiCN, Ru, RuO, Pt, Ti rich $TiO_x$, TiAlN, TaAlN, TiSiN, TaSiN, $IrO_2$ and doped polysilicon. Suitable materials for the bottom electrode are any conducting oxygen rich material such as Ti(O)N, Ta(O)N. TiN and TaN. The thicknesses of the electrodes are typically 1 nm or greater. Thicknesses of the metal oxide are generally in the range of 2 nm to 20 nm.

One example non-volatile memory element uses Hafnium Oxide (e.g., $HfO_2$) as a reversible resistance-switching material, and positions the reversible resistance-switching material between two electrodes. A first electrode is positioned between reversible resistance-switching material and a first conductor (e.g. bit line or word line). In one embodiment, the first electrode is made of platinum. The second electrode is positioned between reversible resistance-switching material a second conductor (e.g., bit line or word line). In one embodiment, the second electrode is made of Titanium Nitride, and serves as a barrier layer. In another embodiment, the second electrode is n+ doped polysilicon and the first electrode is Titanium Nitride. Other materials can also be used. The technologies described below are not restricted to any one set of materials for forming the non-volatile memory elements.

In another embodiment, the memory storage element will include Hafnium Oxide (or different metal oxide or different material) as the reversible resistance-switching material, without any electrodes being positioned between the reversible resistance-switching material and the conductors (e.g., bit lines and/or word lines).

Another class of materials suitable for the memory storage elements is solid electrolytes but since they are electrically conductive when deposited, individual memory elements need to be formed and isolated from one another. Solid electrolytes are somewhat similar to the metal oxides, and the conduction mechanism is assumed to be the formation of a metallic filament between the top and bottom electrode. In this structure the filament is formed by dissolving ions from one electrode (the oxidizable electrode) into the body of the cell (the solid electrolyte). In one example, the solid electrolyte contains silver ions or copper ions, and the oxidizable electrode is preferably a metal intercalated in a transition metal sulfide or selenide material such as $A_x(MB_2)_{1-x}$, where A is Ag or Cu, B is S or Se, and M is a transition metal such as Ta, V, or Ti, and x ranges from about 0.1 to about 0.7. Such a composition minimizes oxidizing unwanted material into the solid electrolyte. One example of such a composition is $Ag_x(TaS_2)_{1-x}$. Alternate composition materials include α-AgI. The other electrode (the indifferent or neutral electrode) should be a good electrical conductor while remaining insoluble in the solid electrolyte material. Examples include metals and compounds such as W, Ni, Mo, Pt, metal silicides, and the like.

Examples of solid electrolytes materials are: TaO, GeSe or GeS. Other systems suitable for use as solid electrolyte cells are: Cu/TaO/W, Ag/GeSe/W, Cu/GeSe/W, Cu/GeS/W, and Ag/GeS/W, where the first material is the oxidizable electrode, the middle material is the solid electrolyte, and the third material is the indifferent (neutral) electrode. Typical thicknesses of the solid electrolyte are between 30 nm and 100 nm.

In recent years, carbon has been extensively studied as a non-volatile memory material. As a non-volatile memory element, carbon is usually used in two forms, conductive (or grapheme like-carbon) and insulating (or amorphous carbon). The difference in the two types of carbon material is the content of the carbon chemical bonds, so called $sp^2$ and $sp^3$ hybridizations. In the $sp^3$ configuration, the carbon valence electrons are kept in strong covalent bonds and as a result the $sp^3$ hybridization is non-conductive. Carbon films in which the $sp^3$ configuration dominates, are commonly referred to as tetrahedral-amorphous carbon, or diamond like. In the $sp^2$ configuration, not all the carbon valence electrons are kept in covalent bonds. The weak tight electrons (phi bonds) contribute to the electrical conduction making the mostly $sp^2$ configuration a conductive carbon material. The operation of the carbon resistive switching nonvolatile memories is based on the fact that it is possible to transform the $sp^3$ configuration to the $sp^2$ configuration by applying appropriate current (or voltage) pulses to the carbon structure. For example, when a very short (1-5 ns) high amplitude voltage pulse is applied across the material, the conductance is greatly reduced as the material $sp^2$ changes into an $sp^3$ form ("reset" state). It has been theorized that the high local temperatures generated by this pulse causes disorder in the material and if the pulse is very short, the carbon "quenches" in an amorphous state ($sp^3$ hybridization). On the other hand, when in the reset state, applying a lower voltage for a longer time (~300 nsec) causes part of the material to change into the sp² form ("set" state). The carbon resistance switching non-volatile memory elements have a capacitor like configuration where the top and bottom electrodes are made of high temperature melting point metals like W, Pd, Pt and TaN.

There has been significant attention recently to the application of carbon nanotubes (CNTs) as a non-volatile memory material. A (single walled) carbon nanotube is a hollow cylinder of carbon, typically a rolled and self-closing sheet one carbon atom thick, with a typical diameter of about 1-2 nm and a length hundreds of times greater. Such nanotubes can demonstrate very high conductivity, and various proposals have been made regarding compatibility with integrated circuit fabrication. It has been proposed to encapsulate "short" CNTs within an inert binder matrix to form a fabric of CNT's. These can be deposited on a silicon wafer using a spin-on or spray coating, and as applied the CNTs have a random orientation with respect to each other. When an electric field is applied across this fabric, the CNTs tend to flex or align themselves such that the conductivity of the fabric is changed. As in the other carbon based resistive switching non-volatile memories, the CNT based memories have capacitor-like configurations with top and bottom electrodes made of high melting point metals such as those mentioned above.

Yet another class of materials suitable for the memory storage elements is phase-change materials. A preferred group of phase-change materials includes chalcogenide glasses, often of a composition $Ge_xSb_yTe_z$, where preferably x=2, y=2 and z=5. GeSb has also been found to be useful. Other materials include AgInSbTe, GeTe, GaSb, BaSbTe, InSbTe and various other combinations of these basic elements. Thicknesses are generally in the range of 1 nm to 500 nm. The generally accepted explanation for the switching mechanism is that when a high energy pulse is applied for a very short time to cause a region of the material to melt, the material "quenches" in an amorphous state, which is a low conductive state. When a lower energy pulse is applied for a longer time such that the temperature remains above the crystallization temperature but below the melting temperature, the material crystallizes to form poly-crystal phases of high conductivity. These devices are often fabricated using sub-lithographic pillars, integrated with heater electrodes. Often the localized region undergoing the phase change may be designed to correspond to a transition over a step edge, or a region where the material crosses over a slot etched in a low thermal conductivity material. The contacting electrodes may be any high melting metal such as TiN, W, WN and TaN in thicknesses from 1 nm to 500 nm.

It will be noted that the memory materials in many of the foregoing examples utilize electrodes on either side thereof whose compositions are specifically selected. In embodiments of the three-dimensional memory array herein where the word lines (WL), local bit lines (LBL) and/or middle electrode layers (MELs) also form these electrodes by direct contact with the memory material, those lines are preferably made of the conductive materials described above. In embodiments using additional conductive segments for at least one of the two memory element electrodes, those segments are therefore made of the materials described above for the memory element electrodes.

For simplicity the above description has consider the simplest case of storing one data value within each cell: each cell is either reset or set and holds one bit of data. However, the techniques of the present application are not limited to this simple case. By using various values of ON resistance and designing the sense amplifiers to be able to discriminate between several of such values, each memory element can hold multiple-bits of data in a multiple-level cell (MLC). The principles of such operation are described in U.S. Pat. No. 5,172,338, which is incorporated by reference in its entirety. Examples of MLC technology applied to three dimensional arrays of memory elements include an article entitled "Multi-bit Memory Using Programmable Metallization Cell Technology" by Kozicki et al., Proceedings of the International Conference on Electronic Devices and Memory, Grenoble, France, Jun. 12-17, 2005, pp. 48-53 and "Time Discrete Voltage Sensing and Iterative Programming Control for a 4F2 Multilevel CBRAM" by Schrogmeier et al. (2007 Symposium on VLSI Circuits), which are both incorporated by reference in their entireties.

FIG. 2A schematically illustrates the electrical connections within a three-dimensional memory array of a ReRAM memory device 200. The device 200 shown in FIG. 2A is similar to the ReRAM device of FIG. 1, except in FIG. 2A, the global bit lines (GBL) and select gates (SG) are depicted at the top of the device 200. The device 200 includes a plurality of vertical bit lines (VBLs) (e.g., the LBLs of FIG. 1) and a plurality of word lines (WLs) extending substantially perpendicular to the bit lines. FIG. 2A schematically illustrates a plurality of memory cells 201 located between the bit lines and the word lines. Each memory cell 201 may include a non-volatile memory element material 203 (e.g., the NVM material of FIG. 1, which is also known as a read/write (RW) material) located between an electrically conductive word line material 205 and an electrically conductive bit line material 207, as shown in the enlarged partial cross-section of FIG. 2B (which is rotated 90° relative to the orientation of FIG. 2A).

In a ReRAM device such as shown in FIGS. 2A-2B, the non-linearity of the I-V curve of each memory cell 201 should be high enough to maintain a good cell selectivity in the case of a large cross-point memory array (i.e., having a large number of memory cells located at the intersections bit lines and word lines). The non-linearity factor distribution of the memory cells is typically quite large. This can lower the worst case of the design specification. One method of improving cell selectivity is by providing a non-linear element (NLE) connected in series with the memory cell 201. This is illustrated in FIGS. 2C and 2D, which show a non-linear element (NLE) 209 located between each memory cell 201 and the vertical bit line (VBL) 207. However, this method presents some challenges in the case of a ReRAM device with a vertical bit line architecture.

For example, as shown in FIG. 2E, the IR drop over the NLE 209 may be relatively high because current flows in a very small area. In the case of a non-volatile memory element material 203 in which the resistance change mechanism may be explained by a filament model, the effective electrode area of the NLE 209 is determined by the filament diameter. The IR drop on the NLE 209 is large because the local current density in the NLE 209 is very large.

One way in which this problem may be addressed is to provide a layer of electrically conductive material (i.e., a middle electrode layer (MEL) 211) between the non-volatile memory element material 203 and the NLE 209, as shown in FIG. 2F. However, in this case, the selectivity of the selected cell 201 is low because the middle electrode 211 is shared between multiple cells 201 on the same vertical bit line 207.

Various embodiments relate to monolithic, three-dimensional memory devices, such as ReRAM devices, and methods of making such devices, that include a plurality of discrete middle electrodes which are isolated from one another. In embodiments, a non-volatile memory element material may be located between a bit line extending in a first (e.g., vertical) direction and a plurality of word lines extending in a second (e.g., horizontal) direction perpendicular to the first direction, and the plurality of middle electrodes may be located between the bit line and the plurality of word lines, wherein the plurality of middle electrodes are discrete electrodes which are isolated from one another in at least the second (e.g., vertical) direction. In various embodiments, the middle electrodes may be adjacent to the non-volatile memory element material, and may electrically couple the non-volatile memory element material in series with a non-linear element located between the bit line and the plurality of word lines.

The discrete, isolated middle electrodes of the various embodiments may allow an independent electrode selection from the vertical bit line material. An IR drop across a non-linear element (NLE) located between the middle electrodes and the bit line may be smaller than in a conventional structure (e.g., such as shown in FIG. 2E) because the current density in the NLE may be relatively smaller. This may provide a reduction in the practical operation voltage of the device. In addition, the isolated middle electrodes may dramatically improve memory cell selectivity relative to prior configurations (e.g., such as shown in FIG. 2F).

An embodiment of a ReRAM memory device 300 according to one embodiment is shown in FIGS. 3A-3C. FIG. 3A is a side cross-section view of the ReRAM memory device 300. The device 300 may include a substrate 310 (e.g., a semiconductor substrate, such as a silicon substrate) having a major surface 312 and a plurality of electrically conductive word lines 305 located over the major surface 312 of the substrate 310. FIG. 3C is a top cross-section view of the device 300 taken through line A-A' in FIG. 3A. As shown in FIG. 3C, each electrically conductive word line 305 may be elongated in a first direction (i.e., the y-axis direction in FIG. 3C) that is substantially parallel to the major surface 312 of the substrate 310. As shown in FIG. 3A, the plurality of electrically conductive word lines 305 may be spaced apart from one another in a second direction (i.e., the z-axis direction in FIG. 3A) that is substantially perpendicular to the major surface 312 of the substrate 310. An electrically insulating material 306 (e.g., an oxide or nitride material, such as silicon oxide or silicon nitride) may be located between each of the spaced apart electrically conductive word lines 305, as shown in FIG. 3A.

The device 300 further includes a plurality of electrically conductive bit lines 307 extending in a direction substantially perpendicular to the major surface 312 of the substrate 310 (i.e., in the z-axis direction in FIG. 3A) and adjacent to the plurality of electrically conductive word lines 305. Each bit line 307 may comprise a generally pillar-shaped structure comprising a first side surface 321 which faces a first plurality of vertically-stacked electrically conductive word lines 305, and a second side surface 323, opposite the first side surface 321, which faces a second plurality of vertically-stacked electrically conductive word lines 305.

A non-volatile memory element material layer 303 may be located between each of the bit lines 307 and the adjacent electrically conductive word line 305. As shown in FIG. 3A, the non-volatile memory element material layer 303 may comprise a continuous layer that extends over the first side surface 321 of the bit line 307 and adjacent to the first plurality of vertically-stacked electrically conductive word lines 305. A second continuous layer of the non-volatile memory element material layer 303 may extend over the second side surface 323 of the bit line 307 and adjacent to the second plurality of vertically-stacked electrically conductive word lines 305.

Individual memory cells 301 (see FIGS. 3B and 3C) may be located at the intersections of the bit lines 307 and the electrically conductive word lines 305, and the non-volatile memory element material layer 303 may comprise a material in which discrete regions of the material located at the intersections of the bit lines 307 and the electrically conductive word lines 305 may be controllably alternated between a more conductive state and a less conductive state by appropriate voltages applied to the bit line 307 and the respective electrically conductive word line 305. Suitable materials for the non-volatile memory element material layer 303 include any of the materials described above. In various embodiments, the non-volatile memory element material layer 303 may comprise a metal oxide material.

As shown in FIG. 3A, the memory device 300 may include a device level 316 containing the bit lines 307, the electrically conductive word line 305 and the non-volatile memory element material layer 303, and a lower level 314 below the device level 316 which may comprise a plurality of select transistors 315. Each select transistor 315 may be connected on a first end to a bit line 307, which may be a local bit line, and on a second end to a global bit line 317 that may be elongated in the x-axis direction.

The device 300 may further include a plurality of middle electrodes 311 comprising an electrically conductive material located between the bit line 307 and each of the plurality of electrically conductive word lines 305. The middle electrodes 311 comprise discrete electrodes which are isolated from one another (i.e., they are physically separated from each other, as shown by arrows 325 in FIG. 3B) along the length of the bit line 307 (i.e., in the z-axis direction in FIGS. 3A and 3B). Each of the middle electrodes 311 may be adjacent to the non-volatile memory element material layer 303, and may electrically connect the non-volatile memory element in series with a non-linear element 309. In the embodiment of FIGS. 3A-3C, the non-linear element 309 is located between the middle electrodes 311 and the bit line 307 and the non-volatile memory element material layer 303 located between the electrically conductive word line 305 and the middle electrodes 311. Alternatively, as described further below, the non-linear element 309 may be located between the middle electrodes 311 and the electrically conductive word line 305 (i.e., the locations of the non-volatile memory element material layer 303 and the non-linear element 309 may be switched relative to the configuration of FIGS. 3A-3C).

The non-linear element 309 may comprise any structure that provides a desired nonlinearity in the current-voltage characteristic over the structure. Exemplary non-linear elements 309 may comprise a metal-insulator-metal (MIM) junction, a metal-insulator-semiconductor (MIS) junction, or a metal-semiconductor (MS) Schottky junction. In embodiments, the middle electrode layer 311 and/or one of the bit line 307 or electrically conductive word line 305 may serve as an electrode (i.e., metal or semiconductor) of the non-linear element 309. In other embodiments, the electrodes (i.e., metal or semiconductor) of the non-linear element 309 may be separate from the middle electrode 311, bit line 307 and electrically conductive word line 305. The electrical transport mode for providing the non-linear properties of the non-linear element 309 may include, for example, Poole-Frenkel (PF) emission, Schottky transport, or a tunneling mode, such as direct, Fowler-Nordheim (FN) and/or trap-assist tunneling.

Figure 4A:
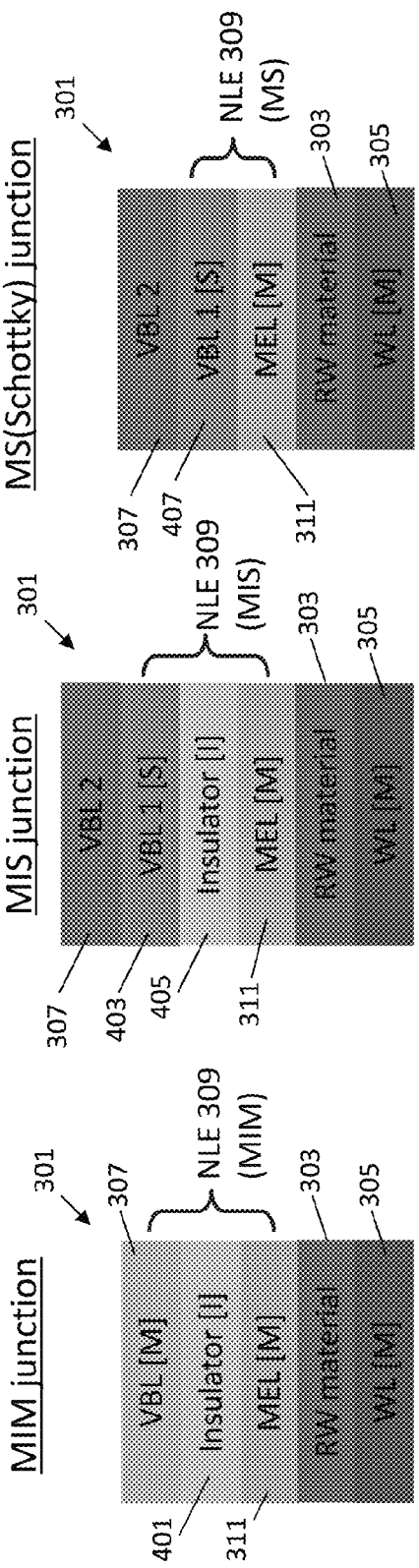
FIG. 4A is a cross-sectional schematic illustration of a non-volatile memory element material connected via a middle electrode to a non-linear element (NLE) comprising a metal-insulator-metal (MIM) junction.

FIGS. 4A-4D illustrate examples of a non-linear element 309 in a memory cell 301 (shown rotated 90° relative to the orientation of FIG. 3B) according to various embodiments. In FIG. 4A, the non-linear element 309 comprises a metal-insulator-metal (MIM) junction. The bit line 307 comprises a metal material that forms a first electrode of the MIM junction. A layer 401 of insulating material is located over the surface of the bit line 307 and forms the insulator of the MIM junction. (The layer 401 of insulating material is shown beneath the bit line 307 in the 90° rotated view of FIG. 4A). The middle electrode layer 311 comprises a metal material that forms the second electrode of the MIM junction. Also shown in FIG. 4A is the non-volatile memory element material layer 303 adjacent to the middle electrode layer 311 which connects the non-volatile memory element material layer 303 in series with the non-linear element 309. The electrically conductive word line 305 is located adjacent to the non-volatile memory element material layer 303, opposite the middle electrode layer 311.

Figure 4B:
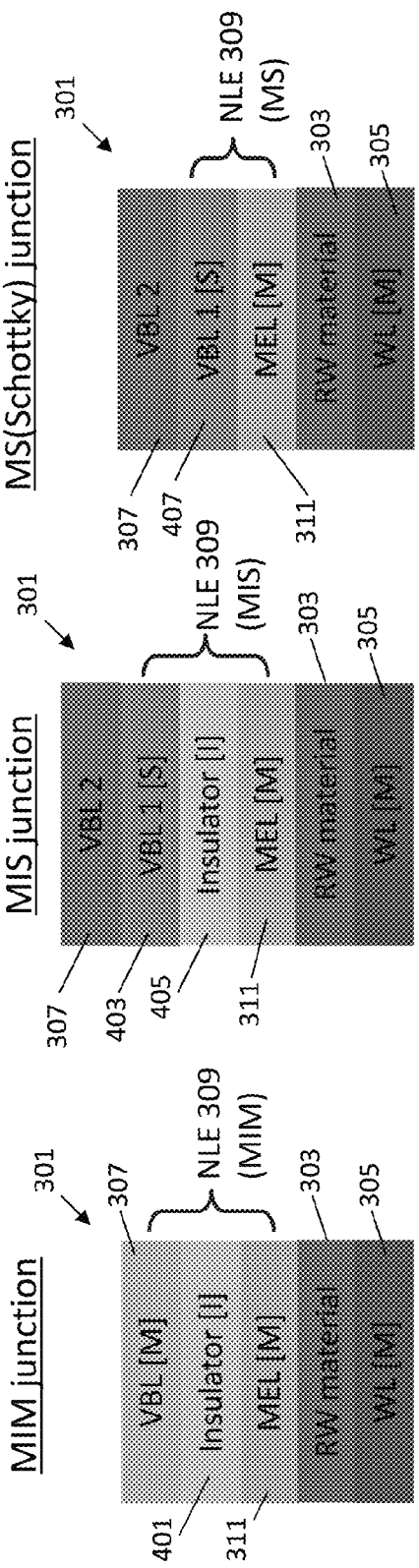
FIG. 4B is a cross-sectional schematic illustration of a non-volatile memory element material connected via a middle electrode to a non-linear element (NLE) comprising a metal-insulator-semiconductor (MIS) junction.

FIG. 4B illustrates a non-linear element 309 which comprises a metal-insulator-semiconductor (MIS) junction. The bit line 307 comprises an electrically conductive material, which may be a metal or heavily doped semiconductor material, for example. A layer 403 of a semiconductor material is located over the electrically conductive bit line 307 and forms the semiconductor electrode of the MIS junction. A layer 405 of an insulating material is located over the layer 403 of semiconductor material, and forms the insulator of the MIS junction. (The respective semiconductor and insulating material layers 403, 405 are shown beneath the bit line 307 in the 90° rotated view of FIG. 4B). The middle electrode layer 311 comprises a metal material that forms the metal electrode of the MIS junction. The non-volatile memory element material layer 303 is located adjacent to the middle electrode layer 311 which connects the non-volatile memory element material layer 303 in series with the non-linear element 309. The electrically conductive word line 305 is located adjacent to the non-volatile memory element material layer 303, opposite the middle electrode layer 311.

Figure 4C:
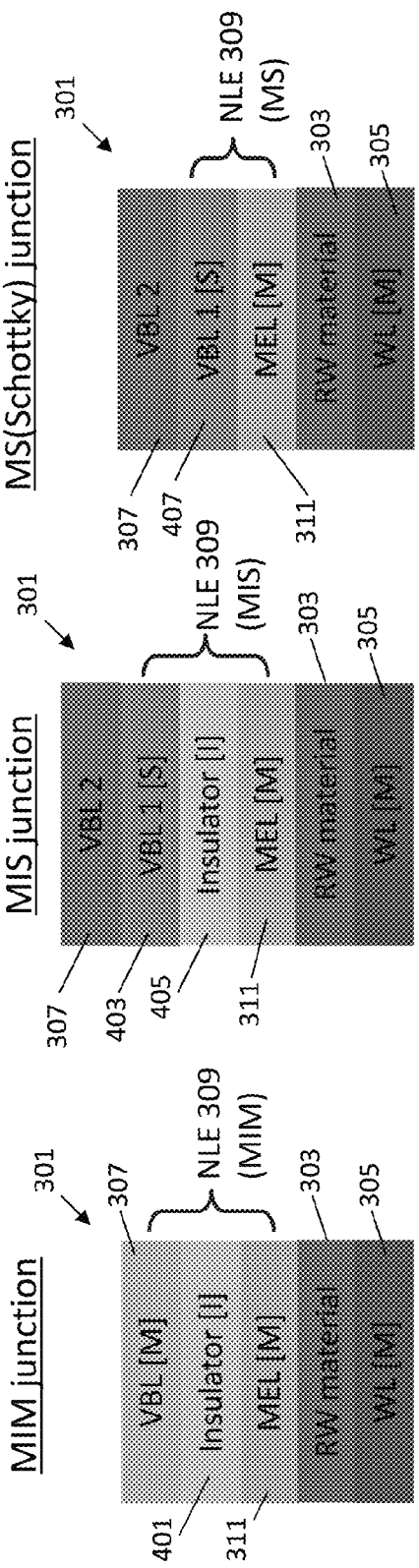
FIG. 4C is a cross-sectional schematic illustration of a non-volatile memory element material connected via a middle electrode to a non-linear element (NLE) comprising a metal-semiconductor (MS) Schottky junction.

FIG. 4C illustrates a non-linear element 309 which comprises a metal-semiconductor (MS) Schottky junction. The bit line 307 comprises an electrically conductive material, which may be a metal or heavily doped semiconductor material, for example. A layer 407 of a semiconductor material is located over the electrically conductive bit line 307 and forms the semiconductor electrode of the MS Schottky junction. (The semiconductor layer 407 is shown beneath the bit line 307 in the 90° rotated view of FIG. 4C). The middle electrode layer 311 comprises a metal material that forms the metal electrode of the MS Schottky junction. The non-volatile memory element material layer 303 is located adjacent to the middle electrode layer 311 which connects the non-volatile memory element material layer 303 in series with the non-linear element 309. The electrically conductive word line 305 is located adjacent to the non-volatile memory element material layer 303, opposite the middle electrode layer 311.

Figure 4D:
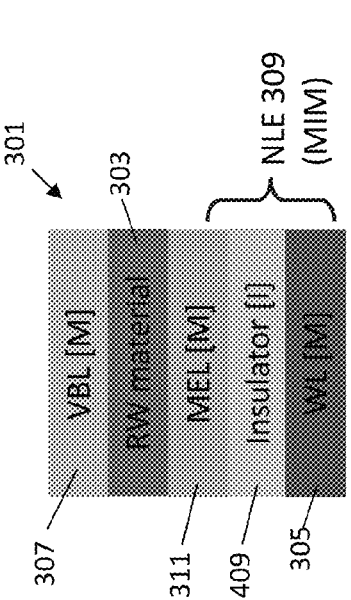
FIG. 4D is a cross-sectional schematic illustration of a non-volatile memory element material connected via a middle electrode to a non-linear element (NLE) comprising a metal-insulator-metal (MIM) junction located between the non-volatile memory element material and a word line of a memory device.

In each of FIGS. 4A-4C, the non-linear element 309 is located between the non-volatile memory element material layer 303 and the bit line 307 in the memory cell 301 (e.g., between the middle electrode layer 311 and the bit line 307). FIG. 4D illustrates an alternative embodiment in which the non-linear element 309 is located between the non-volatile memory element material layer 303 and the electrically conductive word line 305 in the memory cell 301 (e.g., between the middle electrode layer 311 and the electrically conductive word line 305). FIG. 4C illustrates a metal-insulator-metal (MIM) junction non-linear element 309 between the non-volatile memory element material layer 303 and the electrically conductive word line 305, although it will be understood that a MIS junction or MS Schottky junction such as described above could also be located between the non-volatile memory element material layer 303 and the electrically conductive word line 305. As shown in FIG. 4D, electrically conductive word line 305 comprises a metal material that forms a first electrode of the MIM junction. A layer 409 of insulating material is located over the surface of the electrically conductive word line 305 and forms the insulator of the MIM junction. The middle electrode layer 311 comprises a metal material that forms the second electrode of the MIM junction. The non-volatile memory element material layer 303 is adjacent to the middle electrode layer 311 which connects the non-volatile memory element material layer 303 in series with the non-linear element 309. The bit line 307 is located adjacent to the non-volatile memory element material layer 303, opposite the middle electrode layer 311.

In the various embodiments of the non-linear element 309 shown in FIGS. 4A-4D, the metal or semiconductor electrode layers of the MIM, MIS or MS junctions may comprise one or more of Al, Ni, Co, Hf, Zr, Ta, Ti, V, W, Cr, Ir, Pt, Si (doped or undoped) and Ge (doped or undoped). In embodiments, nitrides, silicides, alloys, laminates and graded layers comprising one or more of the above-listed materials may also be utilized.

The insulator layers 401, 405, 409 may comprise any suitable insulating material, such as a stoichiometric or non-stoichiometric oxide or nitride material, including SiO, SiN, AlO, AlN, TaO, HfO, ZrO, TiO, NiO, WO, CoO, VO, NbO, CuO, ZnO, MoO, IrO, MgO, etc (e.g., SiO may be stoichiometric $SiO_2$ or non-stoichiometric $SiO_x$ where x does not equal to 2, etc.).

Referring again to FIGS. 3A-3C, in this embodiment, the non-linear element 309 comprises a metal-insulator-metal (MIM) junction that includes a layer 401 of insulating material over the surfaces 321, 323 of the bit line 307 and located between the bit line 307 and each of the plurality of middle electrodes 311. As shown in the top view of FIG. 3C, the generally pillar-shaped bit line 307 may have a substantially rectangular cross-section, and the insulating layer 401 of the non-linear element 309 may be located adjacent to all four side surfaces (i.e., sidewalls) of the bit line 307, while the plurality of middle electrodes 311 are adjacent to two opposing side surfaces 321, 323 of the bit line 307. In this embodiment, both the bit line 307 and the middle electrodes 311 may comprise a metal material adjacent to the insulating material layer 401 and forming the respective metal electrodes of the MIM junction non-linear element 309.

As illustrated in the enlarged side-cross section view of FIG. 3B, the layer of non-volatile memory element material layer 303 may comprise a plurality of clam shape portions 327 adjacent to each of the plurality of electrically conductive word lines 305. As used herein a "clam" shape is a side cross sectional shape configured similar to an English letter "C". A clam shape has two segments 329, 331 which extend substantially parallel to each other and to the major surface 312 of the substrate 310. The two segments 329, 331 are connected to each other by a third segment 333 which extends substantially perpendicular to the first two segments and the surface 312. Each of the three segments may have a straight shape (e.g., a rectangle side cross sectional shape) or a somewhat curved shape (e.g., rising and falling with the curvature of the underlying topography). The term substantially parallel includes exactly parallel segments as well as segments which deviate by 20 degrees or less from the exact parallel configuration. The term substantially perpendicular includes exactly perpendicular segments as well as segments which deviate by 20 degrees or less from the exact perpendicular configuration. The clam shape preferably contains an opening bounded by the three segments 329, 331, 333 and having a fourth side open. As shown in FIG. 3B, the segments 329, 331 and 333 of the clam shaped portions 327 of the non-volatile memory element material layer 303 may surround the respective middle electrode 311 on three sides of the middle electrode 311.

FIGS. 5A-8B illustrate an embodiment method for fabricating a ReRAM memory device, such as the device 300 shown in FIGS. 3A-3C, according to an embodiment. FIGS. 5A-5K illustrate a first portion of the fabrication process that includes forming a word line stack over a substrate, forming openings through the word line stack, and forming a non-volatile memory element material over the sidewalls of the openings. As shown in FIGS. 5A and 5B, a repeating stack 501 of alternating layers of word line layers 503 and insulating layers 505 is provided over the major surface 312 of a substrate 310. As used herein, a "repeating stack" refers to a stack in which instances of a unit including at least two elements are repeated multiple times along one direction. The insulating layers 505 include a material (i.e., a second material) different from the material (i.e., a first material) of the word line layers 503. FIG. 5A is a side-cross section view in a first plane of the repeating stack 501 (i.e., along the x- and z-axes) and FIG. 5B is a side-cross section view in a second plane perpendicular to the first plane (i.e., along the y- and z-axes) taken along the dashed-dotted line in FIG. 5A.

FIGS. 5A-5B show the repeating stack 501 located directly over the substrate 310 for clarity. In embodiments, there may be one or more additional layers between the substrate 310 and the repeating stack 501, such as the lower level 314 containing the select transistors 315, as shown in FIG. 3A.

The word line layers 503 of the repeating stack 501 may comprise an electrically conductive word line material, and may comprise, for example, a metal or metal alloy, a metal silicide, a metal nitride or a heavily doped semiconductor material. The insulating layers 505 of the repeating stack 501 may comprise an insulating material, such as an oxide or nitride material (e.g., silicon oxide or silicon nitride).

FIG. 5A shows a patterned mask 507 over the top surface of the repeating stack 501. The patterned mask 507 may comprise a hard mask and/or photoresist, which may be formed using photolithography and etching that exposes only portions of the underlying structure intended for removal. In one embodiment, the mask 507 may comprise a silicon nitride hard mask. An etching process may then be used to etch through the patterned mask 507 to remove exposed portions of the repeating stack 501 to form a plurality of openings 509 through the repeating stack 501, as shown in FIGS. 5C and 5D. The openings 509 may comprise trenches elongated in the direction of the y-axis and may include a pair of sidewalls 511, 513 defined by the alternating layers of the word line layers 503 and the insulating layers 505 of the repeating stack 501. FIG. 5C is a side cross-section view in the x-z plane of the repeating stack 501 showing the plurality of trench openings 509. FIG. 5D is a side-cross section view in the y-z plane of the repeating stack 501 taken along the dashed-dotted line in FIG. 5C (i.e., through one of the openings 509). FIG. 5E is a top cross-section view taken along line A-A' of FIG. 5C, and shows that the un-etched portions of the repeating stack 501 between each trench opening 509 and covered by the mask 507 form a plurality of parallel strips elongated in the y-axis direction and spaced apart in the x-axis direction.

In FIGS. 5F, 5G and 5J, the repeating stack 501 may be etched through the trench openings 509 to selectively remove the first material of the word line layers 503 relative to the second material of the insulating layers 505 to provide a plurality of recessed portions 515 along the sidewalls 511, 513 of the trench openings 509. The etching may be a wet chemical etching process using an etchant that has a higher etch rate for the first material of the word line layers 503 than for the second material of the insulating layers 505. FIG. 5F is a side cross-section view in the x-z plane of the repeating stack 501 showing the recessed portions 515. FIG. 5G is a side-cross section view in the y-z plane of the repeating stack 501 taken along the dashed-dotted line in FIG. 5F. FIG. 5J is a top cross-section view taken along line B-B' of FIG. 5F, and shows that the word line layers 503 of the repeating stack 501 are recessed compared to FIG. 5E.

In FIGS. 5H, 5I and 5K, a non-volatile memory element material layer 303 may be formed within the trench openings 509, including over the bottom surfaces 517 of the openings and along the sidewalls 511, 513 of the openings 509, including within the recessed portions 515 along the sidewalls 511, 513 of the trench openings 509. The non-volatile memory element material layer 303 may comprise any of the materials described above in which discrete regions of the material may be controllably alternated between a more conductive state and a less conductive state by the application of a suitable voltage to the region. In one embodiment, the non-volatile memory element material layer 303 may be a metal oxide material and may be formed by atomic layer deposition (ALD).

FIG. 5H is a side cross-section view in the x-z plane of the repeating stack 501 showing the non-volatile memory element material layer 303 located over the sidewalls 511, 513 of the trench openings 509. As shown in FIG. 5H, the layer of the non-volatile memory element material layer 303 may form a "clam" shape such as described above within the recessed portions 515. FIG. 5I is a side-cross section view in the y-z plane of the repeating stack 501 taken along the dashed-dotted line in FIG. 5H, and shows the non-volatile memory element material layer 303 over the bottom surface 517 of a trench opening 509. FIG. 5K is a top cross-section view taken along line C-C' of FIG. 5H, and shows the non-volatile memory element material layer 303 over recessed portions 515 in the sidewalls 511, 513 of the repeating stack 501.

FIGS. 6A-6E illustrate additional steps of the memory device fabrication method, including the formation of a plurality of generally pillar-shaped bit line openings within each of the trench openings 509 of the repeating stack 501. In FIGS. 6A, 6B and 6E, the trench openings 509 may be filled with an insulating material 601, such as an oxide material (e.g., silicon oxide), followed by planarization of the insulating material 601, e.g. by etching or chemical mechanical polishing. The insulating material 601 may be formed in the trench openings 509 by chemical vapor deposition (CVD), for example. The insulating material 601 may be made planar with the top surface of the patterned mask 507, as shown in FIG. 6A. FIG. 6A is a side cross-section view in the x-z plane of the repeating stack 501 showing the insulating material 601 within the trench openings 509. FIG. 6B is a side-cross section view in the y-z plane of the repeating stack 501 taken along the dashed-dotted line in FIG. 6A showing the insulating material 601 within a trench opening 509. FIG. 6E is a top cross-section view taken along line D-D' of FIG. 6A.

A second patterned mask 603 may be formed over the top surface of the repeating stack 501, including over the top surfaces of the first mask 507 and the insulating material 601. The second patterned mask 603 may comprise a hard mask and/or photoresist, which may be formed using photolithography and etching that exposes only portions of the underlying structure intended for removal. The second patterned mask 603 may comprise a plurality of elongated strips 605 that extend in the x-axis direction and are spaced apart in the y-axis direction of FIGS. 6C and 6D. In other words, the strips 605 of the second patterned mask 603 may be substantially perpendicular to the direction in which the trench openings 509 extend.

FIG. 6C is a side cross-section view in the x-z plane of the repeating stack 501 and FIG. 6D is a side cross-section view in the y-z plane of the repeating stack 501. FIG. 6C is taken through the dashed-double-dotted line of FIG. 6D, and FIG. 6D is taken through the dashed-dotted line of FIG. 6C. FIG. 6D illustrates the second patterned mask 603 over the top surface of the repeating stack 501, and shows the elongated strips 605 of the mask 603 that extend in the x-axis direction (i.e., into and out of the page in FIG. 6D and left-to-right in FIG. 6C) and are spaced apart by open regions 607 in the y-axis direction (i.e., left-to-right in FIG. 6D and into and out the page in FIG. 6C). The cross-section view of FIG. 6C is taken through an open region 607 of the second mask 603, and thus the second mask 603 is not visible in FIG. 6C.

An etching process may then be used to etch through the second patterned mask 603 to remove exposed portions of the insulating material 601 to form a plurality of generally rectangular-shaped bit line openings 609 through the insulating material 601. The first patterned mask 507 may protect portions of the repeating stack 501 between the trenches 509 from being etched. The bit line openings 609 may have first and second opposite sidewalls 611, 613 that extend parallel to the sidewalls 511, 513 of the trench opening 509 (see FIG. 5F), and third and fourth opposite sidewalls 615, 617 that extend substantially perpendicular to the first and second sidewalls 611, 613.

The third and fourth sidewalls 615, 617 of the bit line openings 609 may be defined by the insulating material 601. In embodiments, the first and second sidewalls 611, 613 may be defined, at least in part, by the layer of non-volatile memory element material layer 303 extending over the sidewalls 511, 513 of the trench openings 609. At least some insulating material 601 may remain on the first and second sidewalls 611, 613 of the bit line openings 609, such as within the recessed portions 515.

An optional second etching process may be performed to remove additional insulating material 601 and expose the layer of non-volatile memory element material layer 303 on the first and second sidewalls 611, 613 of the bit line openings 609. For example, the first etching process to form the bit line openings 609 in the insulating material 601 may be an anisotropic etching process, such as a reactive-ion etching (RIE) process, and the second etching process may be a wet chemical etching process to remove additional insulating material 601, including from the recessed portions 513. The insulating material 601 is completely removed, including from the recessed portions 513, and the first and second sidewalls 611, 613 of the bit line openings 609 are defined by the non-volatile memory element material layer 303 located over the sidewalls 511, 513 of the trench openings 609. The second etching process may enlarge the size of the bit line openings 609 in the y-axis direction.

FIGS. 7A-7K illustrate additional process steps of the memory device fabrication method according to one embodiment, including the formation of a plurality of isolated middle electrodes 311. In FIGS. 7A, 7B and 7E, an electrically conductive material 701 is formed over the sidewalls 611, 613, 615, 617 of the bit line openings 609. The electrically conductive material 701 may be formed over the non-volatile memory element material layer 303 on the first and second sidewalls 611, 613 of the bit line openings 609, and may completely fill the recessed portions 513, as shown in the side (x-z plane) cross-section view of FIG. 7A. FIG. 7B is a side cross-section view in the y-z plane, taken along the dotted dashed line of FIG. 7A, and shows the electrically conductive material 701 over the third and fourth sidewalls 615, 617 of the bit line openings 609. FIG. 7E is a top cross-section view taken along line G-G' in FIG. 7A, and shows the electrically conductive material 701 over all of the sidewalls of the bit line openings 609 and at least partially filling the bit line openings 609.

In embodiments, the electrically conductive material 701 may comprise any suitable conductive material, such as a metal or metal alloy, a metal nitride, a metal silicide, a heavily doped semiconductor, or combinations of any of these materials. The electrically conductive material 701 may be deposited by CVD and may be planarized (e.g., via etch-back or CMP) to remove the material 701 from outside of the bit line openings 609.

In FIGS. 7C and 7D, portions of the second patterned mask 603 located above the electrically conductive material 701 may be removed to expose the electrically conductive material 701 over the third and fourth sidewalls 615, 617 of the bit line openings 609. In embodiments, the elongated strips 605 of the mask 603 that extend in the x-axis direction (i.e., into and out of the page in FIG. 7D) may be "slimmed" relative to the elongated strips 605 of the mask 603 shown in FIG. 6D. The second patterned mask 603 may comprise a silicon nitride hard mask, for example, and may be slimmed using an etching process that selectively etches the silicon nitride hard mask 603 while leaving underlying layers substantially intact.

In FIGS. 7F, 7G and 7J, portions of the electrically conductive material 701 may be removed from the bit line openings 609 to provide a plurality of isolated middle electrodes 311 within the recessed portions 515. The electrically conductive material 701 may be removed by etching the material 701 through the first patterned mask 507 and the second patterned mask 603 to remove the electrically conductive material 701 from the sidewalls 611, 613, 615, 617 of the bit line openings 609. The etching may be stopped at the non-volatile memory element material layer 303 on the first and second sidewalls 611, 613 of the bit line openings 609 and on the insulating material 601 on the third and fourth sidewalls 615, 617 of the bit line openings 609 while leaving isolated portions of the electrically conductive material 701 within the recessed portions 515 along the opposing first and second sidewalls 611, 613 of the bit line openings 609. This is shown in FIG. 7F, which is a side cross-section view in the x-z plane showing the isolated middle electrodes 311 formed of the electrically conductive material 701 within the recessed portions 513 over the first and second sidewalls 611, 613 of the bit line openings 609. FIG. 7G is a side cross-section view in the y-z plane taken along the dotted dashed line of FIG. 7F that shows the electrically conductive material 701 removed from the third and fourth sidewalls 615, 617 of the bit line openings 609. FIG. 7J is a top cross-section view taken along line H-H' of FIG. 7F.

A non-linear element, such as a metal-insulator-metal (MIM) junction, a metal-insulator-semiconductor (MIS) junction, a tunnel junction and/or a Schottky junction, may then be formed in the bit line openings 609. As shown in FIGS. 7H, 7I and 7K, at least one non-linear element material layer 703 may be formed over the sidewalls 611, 613, 615, 617 of the bit line openings 609. The non-linear element material layer 703 may comprise an insulating material, such as an oxide or nitride material, and may be deposited by atomic layer deposition (ALD). In embodiments, the non-linear element material layer 703 may comprise an insulating material that serves as the insulating layer of a metal-insulator-metal (MIM) non-linear element, such as described above with reference to FIG. 4A. The isolated middle electrodes 311 may provide the first (i.e., metal) electrodes of the MIM non-linear element, and the second metal electrodes of the MIM non-linear element may be provided by metal material bit lines formed in the bit line openings 609, as described further below.

In embodiments where the non-linear element is a metal-insulator-semiconductor (MIS) structure, such as shown in FIG. 4B, the non-linear element material layer 703 may comprise an insulating material, and a semiconductor material (not shown in FIGS. 7H, 7I and 7K) may be formed over the insulating material. The isolated middle electrodes 311 may provide the first (i.e., metal) electrodes of the MIS non-linear element.

In embodiments where the non-linear element is a metal-semiconductor (MS) Schottky structure, such as shown in FIG. 4C, the non-linear element material layer 703 may comprise a semiconductor material. The isolated middle electrodes 311 may provide the first (i.e., metal) electrodes of the MS non-linear element.

FIG. 7H is a side cross-section view in the x-z plane which shows the non-linear element layer 703, which in this embodiment comprises an insulating material layer, formed over the first and second sidewalls 611, 613 of the bit line openings 609 and adjacent to the isolated middle electrodes 311. FIG. 7I is a side cross-section view in the y-z plane, taken along the dotted dashed line of FIG. 7H, which shows the non-linear element layer 703 over the third and fourth sidewalls 615, 617 of the bit line openings 609. FIG. 7J is a top cross-section view taken along line I-I' of FIG. 7H, which shows the non-linear element layer 703 extending around the periphery of the bit line openings 609.

An electrically conductive bit line material 801 may be formed within the bit line openings 609 to form a plurality of bit lines 307, as shown in FIGS. 8A-8B. FIG. 8A is a side-cross section view in the x-z plane and FIG. 8B is a side cross-section view in the y-z plane taken alone the dotted dashed line of FIG. 8A. The electrically conductive bit line material 801 may comprise, for example, a metal or metal alloy, a metal silicide, a metal nitride or a heavily doped semiconductor material. The electrically conductive bit line material 801 may completely fill the bit line openings 609, and may be formed by chemical vapor deposition (CVD), for example. In embodiments, the electrically conductive bit line material 801 may comprise a metal material and may serve as the second metal electrode of a metal-insulator-metal (MIM) non-linear element, where the non-linear element material layer 703 may comprise the insulating material layer and the isolated middle electrodes 311 serve as the first metal electrode. The layers of the word line layer 503 of the repeating stack 501 may comprise the electrically conductive word lines 305 of the memory device, as shown in FIG. 8A.

FIG. 9A is a side cross-section view in the x-z plane of a finished ReRAM memory device 300 fabricated in accordance with the process steps of FIGS. 5A-8B. FIG. 9A illustrates the lower level 314 below the device level 316 which comprises a plurality of select transistors 315. FIG. 9B is a top cross-section view of the ReRAM memory device 300 taken along line J-J' of FIG. 9A, FIG. 9C is a top cross-section view of the ReRAM memory device 300 taken along line K-K' of FIG. 9A, and FIG. 9D is a top cross-section view of the ReRAM memory device 300 taken along line L-L' of FIG. 9A.

In the embodiment of FIGS. 9A-9D, the non-volatile memory element material layer 303 is located adjacent to the electrically conductive word lines 305, and the non-linear element material layer 703 is located between the non-volatile memory element material layer 303 and the bit lines 307. Alternatively, the non-volatile memory element material layer 303 may be located adjacent to the bit lines 307, and the non-linear element material 703 may be located between the non-volatile memory element material layer 303 and the electrically conductive word lines 305. In this alternative embodiment, instead of the non-volatile memory element material layer 303 being formed over the over the sidewalls 511, 513 of the trench openings 509, as shown in FIG. 5H, the non-linear element material 703 may be formed over the sidewalls 511, 513 of the trench openings 509 and may form, at least in part, a non-linear element between the respective electrically conductive word lines 305 and the middle electrodes 311. In addition, instead of the non-linear element material 703 being formed over the sidewalls 611, 613, 615, 617 of the bit line openings 609, as shown in FIGS. 7I-7K, a non-volatile memory element material layer 303 may be formed over the sidewalls 611, 613, 615, 617 of the bit line openings 609. Thus, the non-volatile memory element material layer 303 may be formed adjacent to the bit line 307, and a non-linear element may be located between the non-volatile memory element material layer 303 and the electrically conductive word line 305. The isolated middle electrodes 311 may connect the non-volatile memory element 303 in series with the non-linear element.

According to another aspect of the present disclosure, nonlinearity of I-V curve of VBL cell should be high enough for keeping good cell selectivity in case of large cross-point array. It is difficult to achieve he nonlinearity target only by the read/write (RW) cell's own nonlinearity. Connecting the nonlinear element (NLE) in series with RW cell is a simple method for improving the cell selectivity. In this method, middle electrode (MEL) insertion into between RW material and NLE material provides the function of suppressing the electrical property variation in filament type ReRAM, because effective electrode area of NLE is defined by filament diameter. Filament size affects NLE performance, e.g. IR-drop on NLE and its variation.

Two reference structures are discussed herein to point out the advantage of the embodiments of the present disclosure. A first reference structure is referred to as a "word line-recessed vertical bit line structure," or a "WL-recessed VBL structure." In a WL-recessed VBL structure of the type shown in FIGS. 3A-3C, the actual WL width is reduced due to inserted middle electrodes. The word lines have a short recess distance and a significant thickness to maintain a minimum level of a vertical cross-sectional area for the word lines. Variation of the recess distance has a large impact on the word line resistance. Manufacturing of the first reference structure can be more challenging to achieve the designed controllability in the word line recess depth and the word line stack reactive ion etch (RIE) process. A second reference structure is referred to as an "inter-word line insulator-recessed vertical bit line structure," or an "inter-WL insulator-recessed VBL structure." The inter-WL insulator-recessed VBL structure has a symmetric placement of a lower middle electrode and an upper middle electrode for each word line (i.e., the upper and lower middle electrodes are located above and below the word line, respectively). In this structure, the location of filament formation may be difficult to control, i.e., to control whether filaments are formed in an upper memory cell or in a lower memory cell. Thus, middle electrode-mediated electrical shorts can be a problem for the inter-WL insulator-recessed VBL.

According to an aspect of the present disclosure, an inter-WL insulator-recessed VBL structure is provided to remove the symmetry of the second reference structure, and to reduce or prevent middle electrode-mediated electrical shorts. According to an aspect of the present disclosure, in the inter-WL insulator-recessed VBL structure, an oxygen-scavenging material portion is inserted between at least one non-volatile memory element layer and an electrically conductive word line (see FIG. 11A). The oxygen-scavenging material portion can be recessed with respect to the electrically conductive word lines in order to reduce leakage current. Oxygen-scavenged non-volatile memory element portions preferably do not physically contact any non-linear element, which may be a non-linear element material layer 703 or a vertical transistor, but a respective middle electrode is disposed between each oxygen-scavenged non-volatile memory element and the non-linear element. In this configuration, it is not necessary to reduce the word line width because middle electrodes are arranged between stacked word lines. The middle electrodes are fully electrically isolated from neighboring vertical bit line cells, similar to the prior embodiments.

FIGS. 10A-10J illustrate an array region of an exemplary ReRAM memory device during an exemplary processing sequence. Referring to FIG. 10A, an initial repeating stack of instances of a repetition unit RU0 comprising an insulating layer 505, a oxygen-scavenging material layer 335, and an electrically conductive layer 503 can be formed over a plurality of select transistors 315 (See FIGS. 3A and 9A), which can be formed over a substrate 310 employing any of the methods described above. As used herein, a "repeating stack" refers to a stack of multiple instances of a repetition unit. As used herein, a "repetition unit" refers to a unit that is repeated multiple times in a structure that includes multiple instances of the unit. As used herein, an "initial element" refers to an element that is subsequently modified.

The electrically conductive layer 503 can include the same material as, and have the same thickness as, the word line layers 503 of the embodiments described above. The electrically conductive layers 503 can comprise, for example, a metal or metal alloy, a metal silicide, a metal nitride or a heavily doped semiconductor material. The electrically conductive layers 503 can be deposited by physical vapor deposition or chemical vapor deposition, and can have a thickness in a range from 5 nm to 60 nm, although lesser and greater thicknesses can also be employed.

The insulating layers 505 can include the same material as, and have the same thickness as, the insulating layers 505 of the embodiments described above. For example, the insulating layers 505 can comprise silicon oxide, silicon nitride, a dielectric metal oxide, and/or any other dielectric oxide/nitride/oxynitride. The insulating layers 505 can be deposited by physical vapor deposition or chemical vapor deposition, and can have a thickness in a range from 5 nm to 60 nm, although lesser and greater thicknesses can also be employed.

The oxygen-scavenging material layers 335 include a material having a greater affinity to oxygen than a material of the electrically conductive layers 503. Thus, the choice of materials for the oxygen-scavenging material layers 335 depends on the material for the electrically conductive layers 503. In one embodiment, the oxygen-scavenging material layers 335 can include an electrically conductive material, such as a metal, for example Al, Ni, Co, Hf, Zr, Ta, Ti, V, W, Cr, V, Ir, Pt, a silicide thereof or an electrically conductive alloy thereof, or undoped or doped semiconductor material (such as Si, Ge, alloys thereof, or doped derivatives thereof, such as doped polysilicon), or an electrically conductive or insulating oxide or a nitride of the above metal or semiconductor, or laminates thereof, or graded layers thereof, provided that the material having a greater affinity to oxygen than the material of the electrically conductive layers 503 in order to enable scavenging of oxygen atoms from the electrically conductive layers 503. For example, layers 335 may comprise titanium or tantalum layers for a tantalum oxide layer 303. The oxygen-scavenging material layers 335 can be deposited by physical vapor deposition or chemical vapor deposition. The thickness of each oxygen-scavenging material layer 335 can be in a range from 1 nm to 20 nm, although lesser and greater thicknesses can also be employed.

In one embodiment, the initial repeating stack can be deposited by physical vapor deposition (PVD) processes. The oxygen-scavenging material layers 335 can be protected from oxidation (unless they comprise a metal oxide), for example, by in-situ continuous deposition of all layers of the initial repeating stack in a same physical vapor deposition process tool including multiple physical vapor deposition chambers and a vacuum transfer chamber.

Referring to FIG. 10B, the processing steps of 5A-5E can be performed to pattern the initial repeating stack of instances of the repetition unit RU0 into a repeating stack 501 of instances of a repetition unit RU1 comprising an insulating layer 505, a oxygen-scavenging material portion 335, an electrically conductive word line 305. Each insulating layer 505 at this processing step is a remaining portion of the insulating layer 505 of FIG. 10A. Each oxygen-scavenging material portion 335 at this processing step is a remaining portion of the oxygen-scavenging material layer 335 of FIG. 10A. Each electrically conductive word line 305 at this processing step is a remaining portion of the electrically conductive layer 503 of FIG. 10A. Each repeating stack 501 can be laterally spaced from a neighboring repeating stack 501 by one of the plurality of trench openings 509.

Referring to FIG. 10C, the sidewalls of the oxygen-scavenging material portions 335 and the insulating layers 505 can be laterally recessed with respect to the sidewalls of the electrically conductive word lines 305. Any suitable isotropic etch chemistry that etches the materials of the oxygen-scavenging material portions 335 and the insulating layers 505 selective to the material of the electrically conductive word lines 305 can be employed to laterally recess the oxygen-scavenging material portions 335 and the insulating layers 505 selective to the electrically conductive word lines 305. The lateral recess distance, as measured between a sidewall of a oxygen-scavenging material portion 335 and a most proximate sidewall of an adjoining electrically conductive word liens 305, can be in a range from 2 nm to 12 nm, such as from 3 nm to 8 nm, although lesser and greater lateral recess distances can also be employed. Preferably, the above recess is formed by a two step recess etch in which layers 505 may be recessed first followed by recessing portions 335.

Referring to FIG. 10D, the sidewalls of the insulating layers 505 can be laterally recessed with respect to the sidewalls of the oxygen-scavenging material portions 335 and the electrically conductive word lines 305. Thus, the recesses are formed in a three step etch. Any suitable isotropic etch chemistry that etches the material of the insulating layers 505 selective to the materials of the oxygen-scavenging material portions 335 and the electrically conductive word lines 305 can be employed to laterally recess the insulating layers 505 selective to the oxygen-scavenging material portions 335 and the electrically conductive word lines 305. The lateral recess distance, as measured between a sidewall of an insulating layer 505 and a most proximate sidewall of an adjoining oxygen-scavenging material portion 335, can be in a range from 2 nm to 12 nm, such as from 3 nm to 8 nm, although lesser and greater lateral recess distances can also be employed.

During the processing steps of FIGS. 10C and 10D, lateral recesses 619 are formed by recessing the sidewalls of the oxygen-scavenging material portions 335 and the sidewalls of the insulating layers 505 with respect to sidewalls of the electrically conductive word lines 305. The sequence of processing steps of FIGS. 10C and 10D can provide precise control of the lateral recess distances. The lateral recessing of the oxygen-scavenging material portions 335 and the insulating layers 505 can be performed in any order, or may be performed simultaneously partly or fully. Such variations are expressly contemplated herein.

Referring to FIG. 10E, at least one non-volatile memory element layer 303 can be formed on the physically exposed surfaces of the repeating stacks 501. Specifically, the at least one non-volatile memory element layer 303 can be formed on the sidewalls of the electrically conductive word lines 305 and on the recessed sidewalls of the oxygen-scavenging material portions 335 and the insulating layers 505. Further, the at least one non-volatile memory element layer 303 can be deposited on physically exposed horizontal surfaces of the electrically conductive word lines 305 and the oxygen-scavenging material portion 335.

The at least one non-volatile memory element layer 303 can have the same composition as, and the same thickness as, in the embodiments described above. In an illustrative embodiment, the at least one non-volatile memory element layer 303 can be a resistive memory material layer. As used herein, a "resistive memory material" or a "reversibly resistance-switching material" is a material of which the resistivity can be altered by application of an electrical bias voltage across the material. As used herein, a "resistive memory material layer" refers to a layer including a resistive memory material. As used herein, a "resistive memory element" refers to a portion of a resistive memory material.

Examples of the resistive memory material include metal oxides, such as dielectric metal oxides through which reversible formation of conductive filaments can occur. Such dielectric metal oxides include, but are not limited to, oxides of Hf, Ti, Zr, Al, and Ta. The resistive memory materials provide reversible resistance switching by formation and erasure of conductive filaments. In a configuration in which a reversibly resistance-switching material is disposed between a first electrode (e.g., a word line or a vertical bit line) and a second electrode (e.g., a vertical bit line or a word line), conductive filaments can be formed within the reversibly resistance-switching material by application of an electrical bias, and can be removed from the reversibly resistance-switching material by application of a reverse electrical bias. In a non-limiting illustrative example, the first electrode can be made of titanium nitride (or any material that can be employed as the first electrically conductive material of the conductive material layers 305), and the second electrode (e.g., VBL 307) can be made of platinum or n-doped polysilicon (or any material that can be employed as a second electrically conductive material of electrically conductive lines to be subsequently formed). The device of the present disclosure is not restricted to any one set of materials for forming the non-volatile memory elements.

Dielectric metal oxides are insulating when initially deposited. A metal oxide can be formed with oxygen deficiencies (e.g., vacancies), or can be annealed to form oxygen deficiencies. The second electrode can include a high work function material having a work function greater than 4.5 eV, and can be employed to provide a high potential barrier for electrons at the interface with the reversibly resistance-switching material. As a result, at moderate voltages (below one volt), a very low current will flow through the reversibly resistance-switching material. The energy barrier at the interface between the second electrode and the reversibly resistance-switching material can be lowered by the presence of the oxygen vacancies ($O^{+2}$). In this case, the interface between the second electrode and the reversibly resistance-switching material can provide the characteristics of a low resistance contact (Ohmic contact). The oxygen vacancies in the metal oxide of the reversibly resistance-switching material function as n-type dopants, thereby transforming the originally insulating metal oxide into an electrically insulating material having a lower resistivity (but still insulating). The resulting composite structure is in a non-conductive (high resistance) state in the absence of conductive filaments therein.

When a large forward bias voltage (such as a negative voltage of about −1.5 volt that is applied to the second electrode with respect to the first electrode) is applied across the reversibly resistance-switching material, the oxygen vacancies drift toward the interface between the high energy barrier material (such as platinum or n-doped polysilicon) and the reversibly resistance-switching material, and as a result, the potential barrier at the interface between the second electrode and the reversibly resistance-switching material is reduced and a relatively high current can flow through the structure. The device is then in its low resistance (conductive) state in which the reversibly resistance-switching material functions as a semiconducting material or a conductive material. Without wishing to be bound by a particular theory, it is believed that conduction occurs by formation of conductive filaments having a high density of oxygen vacancies, which may occur along grain boundaries.

The conductive path can be broken by applying a large reverse bias voltage (such as a positive voltage of about 1.5 volt that is applied to the second electrode with respect to the first electrode) across the reversibly resistance-switching material. Under a suitable reverse bias condition, the oxygen vacancies move away from the proximity of the interface between the high work function material and the reversibly resistance-switching material, and "break" the conductive filament. The resistivity of the reversibly resistance-switching material returns to its high resistance state. Both of the conductive and non-conductive states are non-volatile. Sensing the conduction of the memory storage element (for example, by applying a voltage around 0.5 volts) can easily determine the state of the memory element.

While this specific conduction mechanism may not apply to all metal oxides, as a group, they have a similar behavior: transition from a low conductive state to a high conductive occurs state when appropriate voltages are applied, and the two states are non-volatile. Examples of other materials that can be used for the non-volatile memory elements include hafnium oxide, such as HfO, where $1.9<x<2.1$. Suitable materials for the first electrode (e.g., word line) are any conducting material such as Ti(O)N, Ta(O)N, TiN and TaN. Suitable materials for the second electrode (e.g., vertical bit line) include metals and doped semiconductor with a high work function (typically >4.5 eV) capable to getter oxygen in contact with the metal oxide to create oxygen vacancies at the contact. Some examples are TaCN, TiCN, Ru, $RuO_2$, Pt, Ti rich $TiO_x$, TiAlN, TaAlN, TiSiN, TaSiN, $IrO_2$ and doped polysilicon. The thicknesses of the electrodes are typically 1 nm or greater. Thicknesses of the metal oxide can be generally in the range of 2 nm to 8 nm, such as from 3 nm to 6 nm, although lesser and greater thicknesses can also be employed.

Referring to FIG. 10F, the plurality of trench openings 509 can be filled with a sacrificial material layer 607 that includes a material that can be removed selective to the at least one non-volatile memory element layer 303. In an illustrative example, the sacrificial material layer 607 can include a semiconductor material such as silicon, germanium, or an alloy thereof, or can include a dielectric material such as undoped silicate glass (i.e., silicon oxide), doped silicate glass, or organosilicate glass. The sacrificial material layer 607 can be deposited by a conformal deposition method such as chemical vapor deposition, or can be deposited by spin coating.

Referring to FIG. 10G, the sacrificial material layer 607 can be patterned in the same manner as the processing steps of FIGS. 6D, 6E, and 7A-7E to form rectangular-shaped bit line openings 609 that separate remaining portions of the sacrificial material layer 607. The pattern of the rectangular-shaped bit line openings 609 can be as illustrated in FIGS. 7A-7E, except that the portions of the insulating material 601 are replaced with remaining portions of the sacrificial material layer 607 in the structure of FIG. 10G. Thus, each trench opening 509 as provided at the processing steps of FIG. 10B is filled with a repetition of a combination of a rectangular-shaped bit line opening 609 and a sacrificial material portion having a pillar shape (which is a remaining portion of the sacrificial material layer 607). Sidewalls of the at least one non-volatile memory element layer 303 are physically exposed on two sides of each rectangular-shaped bit line opening 609, and sidewalls of two pillar shapes are physically exposed on two additional sides of each rectangular-shaped bit line opening 609.

Referring to FIG. 10H, a middle electrode layer 311L is deposited at each periphery of the rectangular-shaped bit line openings 609. Each unfilled volume within the rectangular-shaped bit line opening 609 is herein referred to as a bit line cavity 609'. The middle electrode layer 311L includes a conductive material selected from Al, Ni, Co, Hf, Zr, Ta, Ti, V, W, Cr, V, Ir, Pt, undoped or doped semiconductor material (such as Si, Ge, alloys thereof, or doped derivatives thereof), a conductive oxide, a conductive nitride, a conductive silicide, metallic alloys, laminates thereof, and graded layers thereof. The lateral recesses 619 at each level of the insulating layers 505 and the oxygen-scavenging material portions 335 can be filled with the middle electrode layer 311L.

Referring to FIG. 10I, a recess etch can be formed to remove portions of the middle electrode layer 311L from outside the lateral recesses. An anisotropic etch, an isotropic etch, or a combination thereof can be employed so that outer sidewalls of the remaining portions of the middle electrode layer 311L are substantially vertically coincident with outermost sidewalls of the at least one non-volatile memory element layer 303 that are located at levels of the electrically conductive word lines 305. As used herein, a first sidewall and a second sidewall are "vertically coincident" if there exists a vertical plane that includes the first sidewall and the second sidewall. Each bit line cavity 609' is laterally expanded to form a rectangular-shaped bit line opening 609. Each remaining portion of the middle electrode layer 311L constitutes a middle electrode 311. Two vertical stacks of middle electrodes 311 can be formed around each rectangular-shaped bit line openings 609. A plurality of vertical stacks of middle electrodes 311 can be located on each side of a repeating stack 501. The middle electrodes 311 are formed in the lateral recesses 619 and on sidewalls and horizontal surfaces of the at least one non-volatile memory element layer 303.

Referring to FIG. 10J, at least one non-linear element material layer 703 is formed on the physically exposed sidewalls of the at least one non-volatile memory element layer 303 and the outer sidewalls of the middle electrodes 311. The at least one non-linear element material layer 703 includes one or more elements that provide non-linear I-V characteristics, i.e., a non-Ohmic current-voltage relationship. In one embodiment, the at least one non-linear element material layer 703 can include one or more of a silicon-based diode, a oxide-containing p-n junction diode, a metal-oxide Schottky barrier device, a ovonic threshold switching (OTS) device, a metal-insulator transition (MIT) device, a single layer oxide-based access device, a single layer nitride-based access device, a multilayer oxide-based access device, a multilayer nitride-based access device, a mixed-ionic-electronic-conduction (MIEC) device or an assembly of a semiconductor channel layer, a gate dielectric layer, and a gate electrode (i.e., a vertical transistor). Alternatively or additionally, a dielectric material layer including materials such as SiO, SiN, AlO, AlN, TaO, HfO, ZrO, TiO, NiO, WO, CoO, VO, NbO, CuO, ZnO, MoO, IrO, and MgO may be employed. Alternatively or additionally, a laminate and/or a graded layer of above-listed materials can also be employed for the at least one non-linear element material layer 703. The thickness of the at least one non-linear element material layer 703 can be in a range from 2 nm to 30 nm, although lesser and greater thicknesses can also be employed.

A vertical bit line can be formed within the unfilled volume of each rectangular-shaped bit line openings 609. Each electrically conductive bit line 307 includes a conductive material. Each bit line can be formed directly on the at least one non-linear element material layer 703. The bit lines can include a conductive material selected from Al, Ni, Co, Hf, Zr, Ta, Ti, V, W, Cr, V, Ir, Pt, undoped or doped semiconductor material (such as Si, Ge, alloys thereof, or doped derivatives thereof, such as doped polysilicon), a conductive oxide, a conductive nitride, a conductive silicide, metallic alloys, laminates thereof, and graded layers thereof.

Figure 11D:
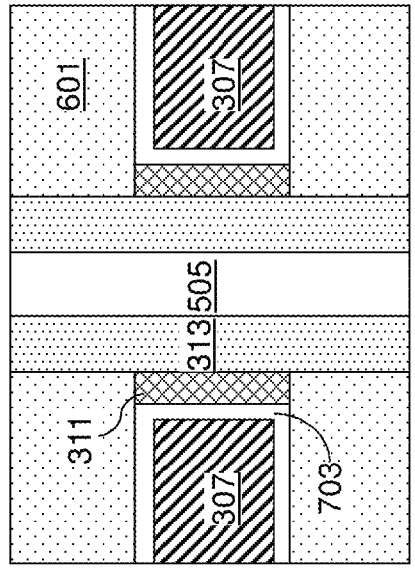
Figure 11E:
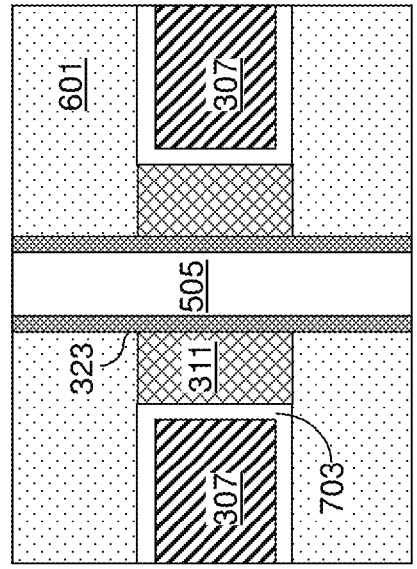
Figure 11B:
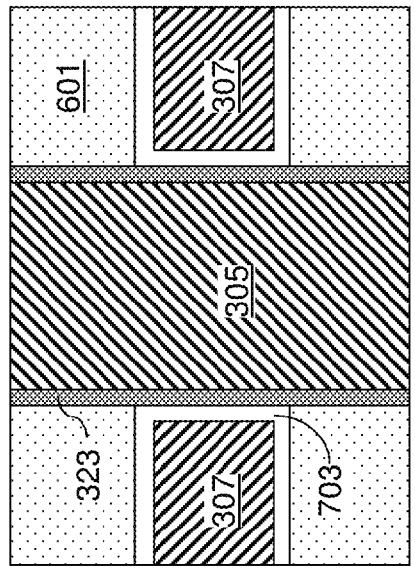
Figure 11C:
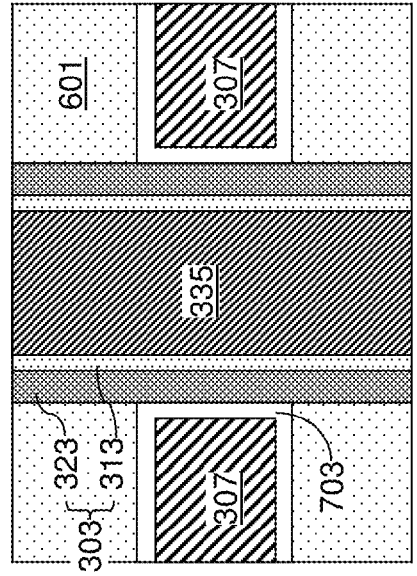

Subsequently, remaining portions of the sacrificial material layer 607 between the bit lines can be replaced with insulator material portions 601 to form the structure illustrated in FIGS. 11A-11E. FIG. 11A is a vertical cross-sectional view. FIG. 11B is a horizontal cross-sectional view along the plane B-B', FIG. 11C is a horizontal cross-sectional view along the plane C-C', FIG. 11D is a horizontal cross-sectional view along the plane D-D', and FIG. 11E is a horizontal cross-sectional view along the plane E-E' in FIG. 11A. FIGS. 11A-11E explicitly illustrate oxygen-scavenged non-volatile memory element portions 313, which are portions of the at least one non-volatile memory element layer 303 that are oxygen-scavenged, and non-scavenged non-volatile memory element portions 323, which are portions of the at least one non-volatile memory element layer 303 that are not oxygen-scavenged. FIG. 11F is a close up vertical cross-sectional view of one memory cell 350 of the device of FIG. 11A. The read/write portion 352 of the memory cell 350 is vertically offset (e.g., located below) the word line 305 in each memory cell 350. Without wishing to be bound by a particular theory, it is believed that the read/write portion 352 includes the oxygen-scavenged non-volatile memory element portion 313 through which the conductive filament can be formed between the word line 305 and oxygen scavenging material portion 335 stack and the middle electrode 311 in each memory cell. The NLE 703 of each memory cell 350 is located between the middle electrode 311 and the VBL 307.

FIGS. 12A-12F illustrate alternative embodiments of the exemplary ReRAM memory device of FIGS. 11A-11E.

Figure 12A:
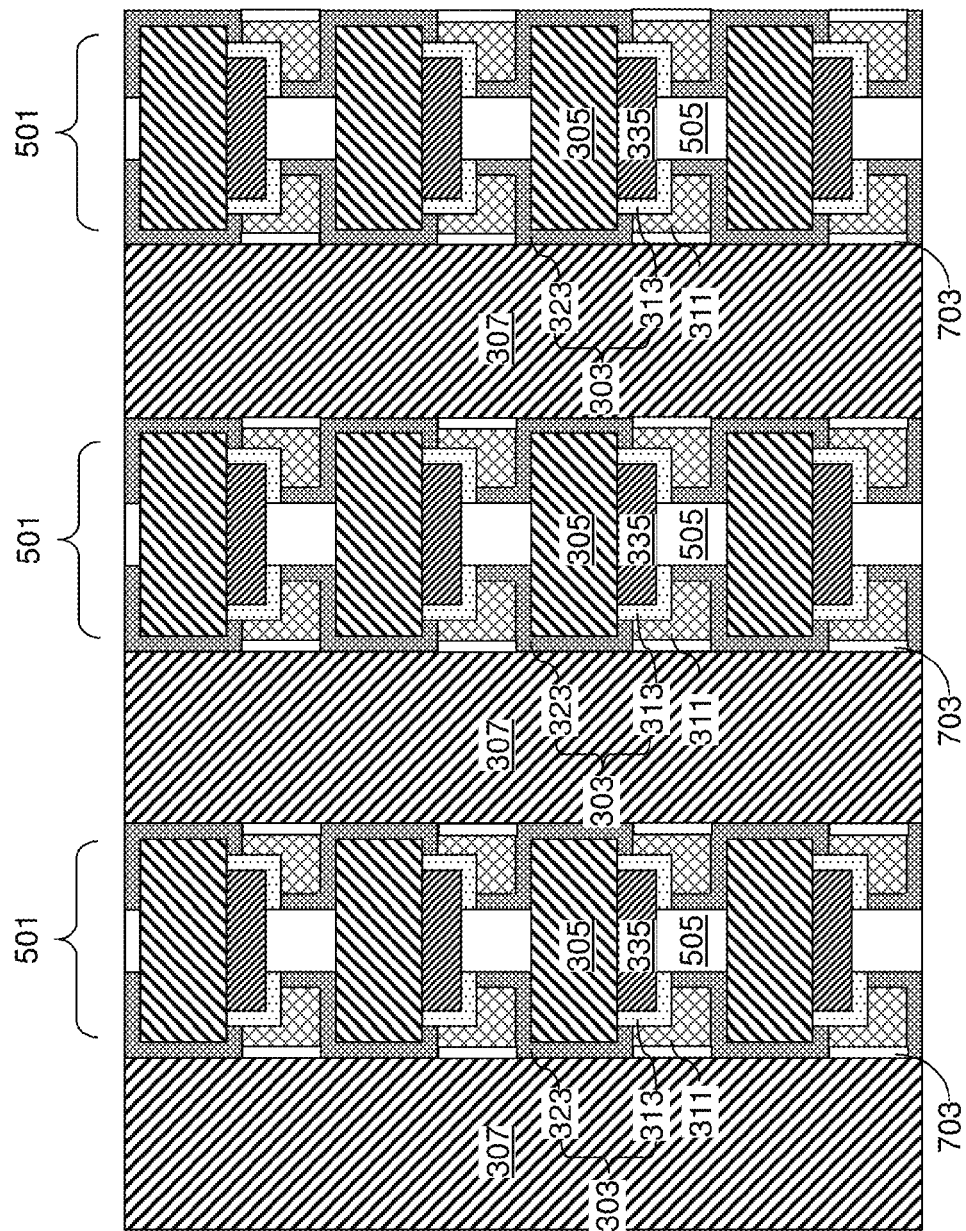

In the exemplary structure of FIGS. 11A-11E, the at least one non-linear element material layer 703 comprises a continuous non-linear element material layer that contacts the middle electrodes 311 and extends along the direction of repetition in the repeating stack 501, i.e., along the vertical direction. In the embodiment of FIG. 12A, the at least one non-linear element material layer 703 comprises a plurality of discrete non-linear element material layers 703. Each of the plurality of discrete non-linear element material layers 703 contacts only one of the middle electrodes 311. The plurality of discrete non-linear element material layers 703 can be formed by a selective deposition process, or can be formed by conversion of surface portions of the middle electrodes 311, for example, by oxidation, nitridation, and/or oxynitridation.

Figure 12B:
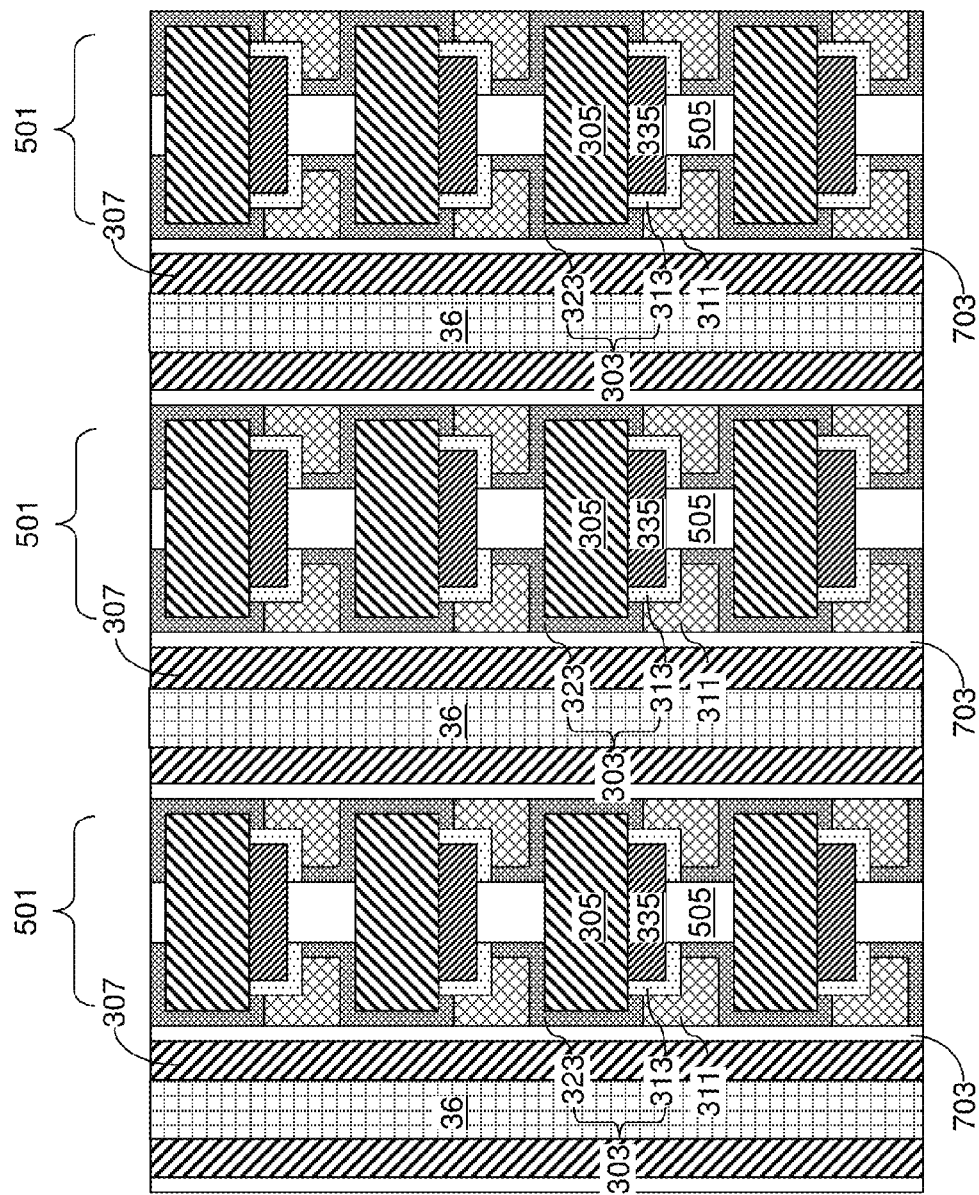

Referring to FIG. 12B, each electrically conductive bit line 307 can be formed as a hollow structure, i.e., a structure including a central vertical cavity therethrough. Such electrically conductive bit lines 307 can be deposited by an incomplete fill of the rectangular-shaped bit line openings 609 with a conductive material layer, and an optional anisotropic etch that removes horizontal portions of the conductive material layer. In this case, a core 36 within each electrically conductive bit line 307 may be filled with a dielectric material such as silicon oxide (i.e., may be a dielectric core), or may be left as a cavity (i.e., may be an air gap core).

Figure 12C:
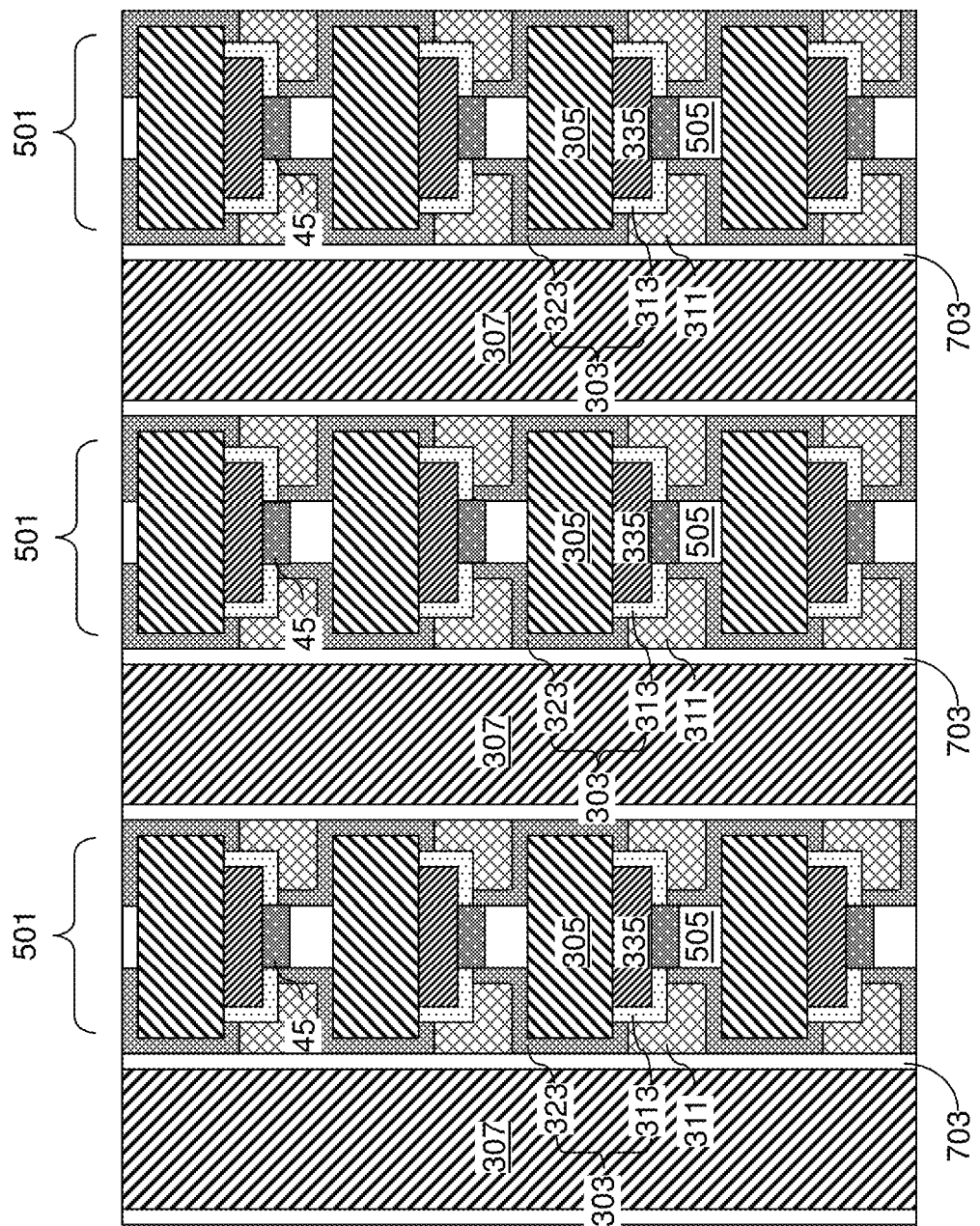

Referring to FIG. 12C, a dielectric blocking material layer that includes a dielectric material that retards diffusion of metallic elements can be formed within each repetition unit RU0 at the processing steps of FIG. 10A. Specifically, each dielectric blocking material layer can be deposited directly on a respective underlying insulator layer 505, and a respective oxygen-scavenging material layer can be deposited directly on the top surface of the dielectric blocking material layer. In one embodiment, the dielectric blocking material layer can include silicon nitride or aluminum oxide. The thickness of the dielectric blocking material layer can be in a range from 2 nm to 8 nm, although lesser and greater thicknesses can also be employed. The dielectric blocking material layers can be laterally recessed with the insulating layers at the processing steps of FIGS. 10C and 10D. In this case, a dielectric blocking material portion 45, which is a remaining portion of the dielectric blocking material layer after the processing steps of FIGS. 10C and 10D, contacts a respective insulating layer 505 and an overlying oxygen-scavenging material portion 335. The dielectric blocking material portions 45 reduce the leakage current between neighboring pairs of electrically conductive word lines 305.

Figure 12D:
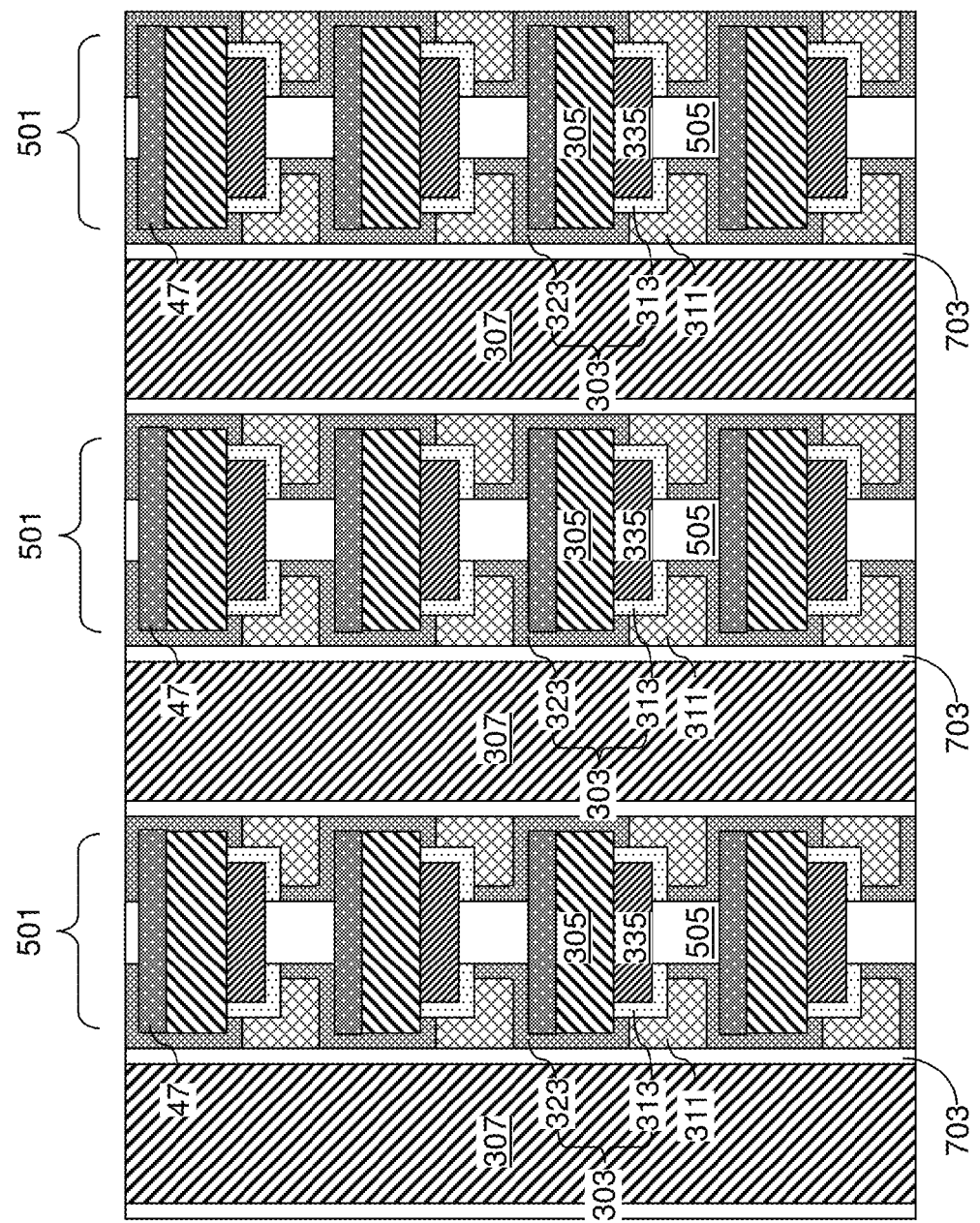

Referring to FIG. 12D, a dielectric blocking material layer that includes a dielectric material that retards diffusion of metallic elements can be formed within each repetition unit RU0 at the processing steps of FIG. 10A. Specifically, each dielectric blocking material layer can be deposited directly on a respective word line layer 503, and an insulator layer 505 of the next repetition unit RU0 can be deposited on the dielectric blocking material layer. In one embodiment, the dielectric blocking material layer can include silicon nitride or aluminum oxide. The thickness of the dielectric blocking material layer can be in a range from 2 nm to 8 nm, although lesser and greater thicknesses can also be employed. The dielectric blocking material layers are not laterally recessed substantially at the processing steps of FIGS. 10C and 10D. In this case, a dielectric blocking material portion 47, which is a remaining portion of the dielectric blocking material layer after the processing steps of FIGS. 10C and 10D, contacts a respective insulating layer 505 and an underlying electrically conductive word line 305. The dielectric blocking material portions 47 reduce the leakage current between neighboring pairs of electrically conductive word lines 305.

Figure 12E:
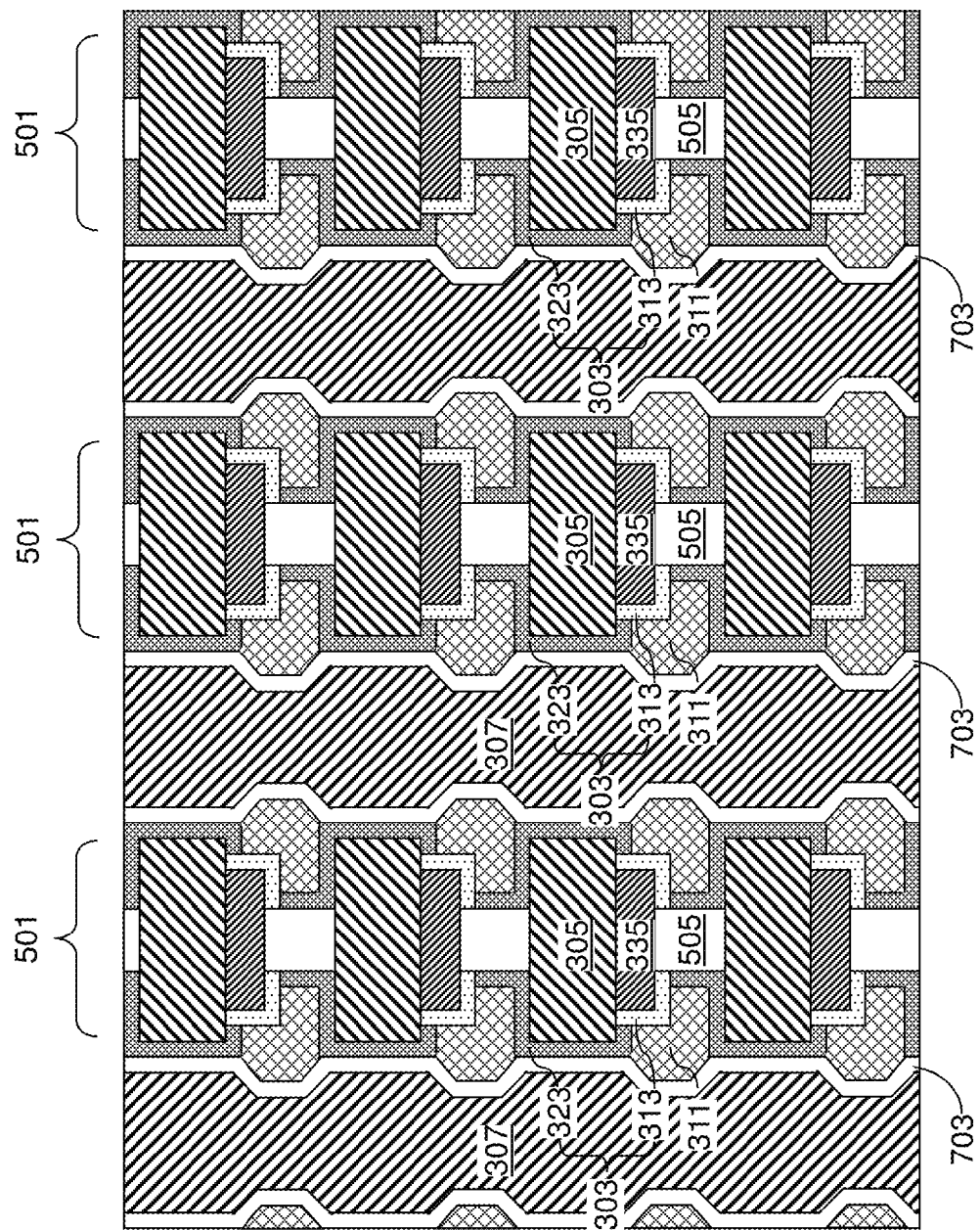

Referring to FIG. 12E, another embodiment of the exemplary structure is illustrated, which can be formed by selectively growing the middle electrodes 311 employing a selective deposition process after performing the processing steps of FIG. 10I. In this case, a conductive material can be selectively deposited only on the surfaces of the middle electrodes 311 without inducing deposition on the surfaces of the at least one non-volatile memory element layer 303. For example, the at least one non-volatile memory element layer 303 can include a dielectric material, and the conductive material can be a metallic material (such as W, Co, or Ru) or a doped semiconductor material (such as doped silicon) that is deposited only on the sidewalls of the pre-existing middle electrodes 311. The middle electrodes 311 can laterally grow into the rectangular-shaped bit line openings 609 without merging with other middle electrodes 311. Thus, each middle electrode 311 includes laterally protruding surfaces that protrude away from a respective insulating layer 505 located at a same level and into a respective rectangular-shaped bit line openings 609. The middle electrodes 311 can be formed with convex sidewalls. The middle electrodes 311 may have the same composition throughout, or may include two material portions having different compositions in case the selectively deposited material is different from the previously formed portion of the middle electrodes 311. Subsequently, the at least one non-linear element material layer 703 and the electrically conductive bit lines 307 can be deposited employing the processing steps of FIG. 10J. Subsequently, portions of the sacrificial material layer 607 can be replaced with dielectric material portions 601.

Figure 12F:
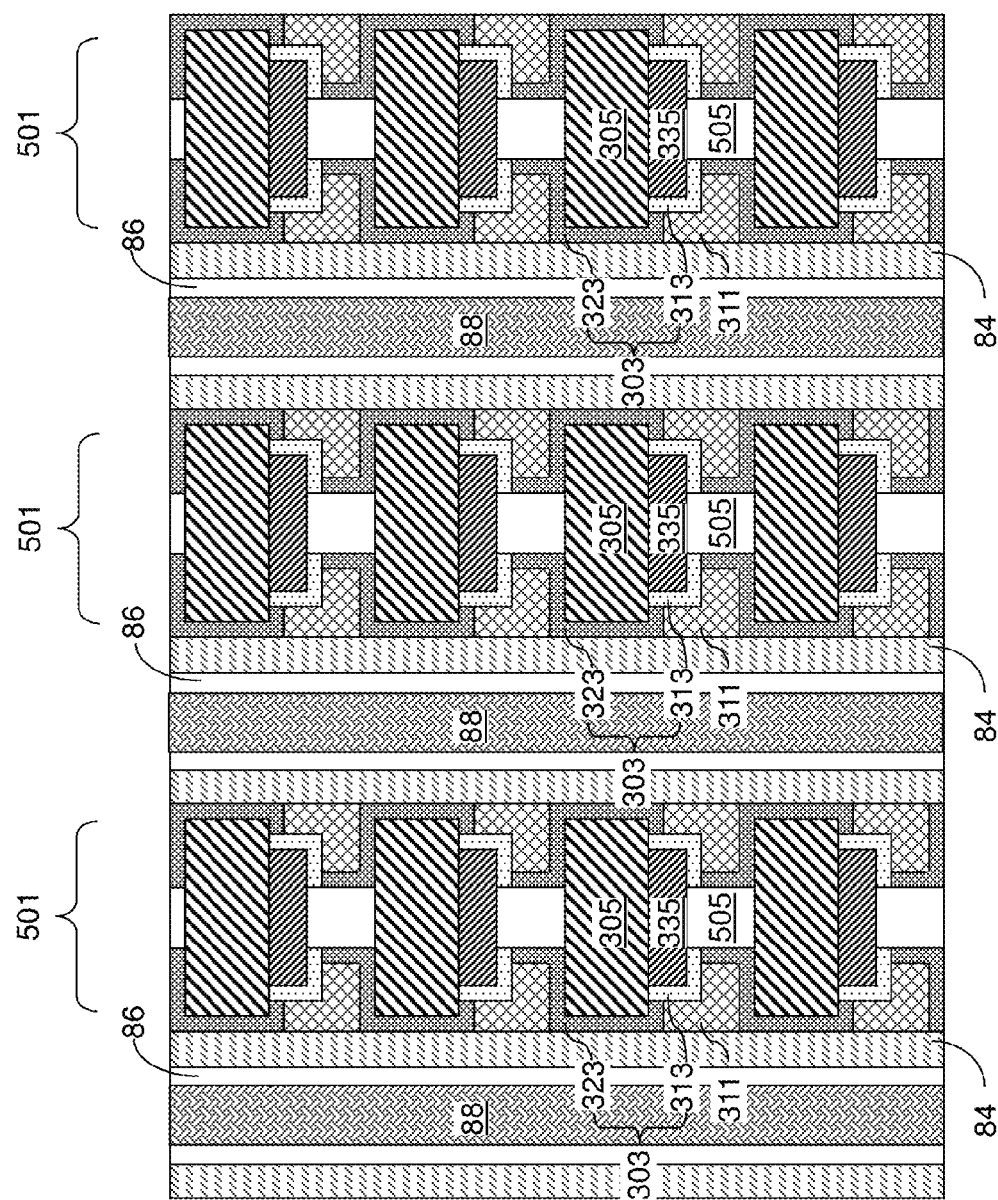

Referring to FIG. 12F, another embodiment of the present disclosure can be derived from the exemplary structure of FIG. 10I by forming each non-linear element material layer and bit line as an assembly of a semiconductor channel layer 84, a gate dielectric layer 86, and a gate electrode 88. Each sub-assembly of a semiconductor channel layer 84 and a gate dielectric layer 86 constitute the at least one non-linear element material layer, and the bit line functions as the gate electrode 88 for the gate dielectric layer. Thus, the bit line is integrated with a transistor that functions as a non-linear element. The semiconductor channel layer 84 includes a semiconductor material that is conformally deposited on the sidewalls of each rectangular-shaped bit line openings 609. The gate dielectric layer 86 includes a conformal dielectric material that can be formed by oxidation of a surface portion of each semiconductor channel layer 84, or by deposition of a conformal dielectric material layer. The gate electrode 88 includes a conductive material.

According to various aspects of the present disclosure, a monolithic three-dimensional memory device is provided, which includes a repeating stack 501 of instances of a repetition unit RU1 comprising an insulating layer 505, a oxygen-scavenging material portion 335, and an electrically conductive word line 305. The repeating stack 501 is located over a substrate 310, and the oxygen-scavenging material portion 335 comprises a conductive material having a greater affinity to oxygen than a material of the electrically conductive word line 305. The monolithic three-dimensional memory device includes at least one non-volatile memory element layer 303 including oxygen-scavenged non-volatile memory element portions 313 and non-scavenged non-volatile memory element portions 323. A material composition of the oxygen-scavenged non-volatile memory element portions 313 differs from a composition of the non-scavenged non-volatile memory element portions 323 by a lower atomic oxygen concentration due to removal of the oxygen atoms therefrom by the oxygen-scavenging material portions 335. The monolithic three-dimensional memory device includes at least one non-linear element material layer 703 located on the at least one non-volatile memory element layer 303, and at least one bit line 307 contacting the at least one non-linear element material layer 303 and extending along a direction of repetition of the repeating stack 501 (i.e., along the vertical direction which is perpendicular to the top surface of the substrate).

Middle electrodes 311 can be located at same levels as the insulating layers 505 and can contact a respective oxygen-scavenged non-volatile memory element portion 313. Sidewalls of the insulating layers 505 can be recessed with respect to sidewalls of the oxygen-scavenging material portions 335. Each middle electrode 311 can contact a sidewall and a bottom surface of a respective oxygen-scavenged non-volatile memory element portion 313. Each of the middle electrodes 311 can contact a bottom surface of an overlying non-scavenged non-volatile memory element portion 323 and a top surface of an underlying non-scavenged non-volatile memory element portion 323. The oxygen-scavenged non-volatile memory material portions 313 do not physically contact the at least one non-linear element material layer 703, but are laterally spaced from the at least one non-linear element material layer 703 by a respective middle electrode 311.

The single-sided (i.e., located on one side of the conductive word line 305, such as the top or bottom side) oxygen-scavenging material portions 335 break the up-down symmetry of the array, and cause electrical current to follow only through the oxygen-scavenged non-volatile memory element portion 313 in one direction, which are portions of the at least one non-volatile memory element layer 303.

The middle electrodes 311 can be introduced to each memory cell without decreasing the width of the electrically conductive word lines 305. As a result, cell selectivity is dramatically improved while suppressing electrical property variations compared with the conventional bilayer structures that do not employ middle electrodes 311. Recess amount variation has little impact to electrical properties, whereas the thickness of oxygen-scavenger material portions 335 and the thickness of the insulator layers 505 have a strong impact on the electrical properties. Oxygen-scavenger material portions also have positive impact on other switching properties, such as forming voltage reduction and programming/erasing endurance improvement.

Regarding electrical properties, forming voltage is dramatically reduced when an oxygen-scavenger material portion 335 is present between the at least one non-volatile memory element layer 303 and the middle electrode 311. In this case, the conductive filaments are formed only in the oxygen-scavenged non-volatile memory element portions 313, but not in the non-scavenged non-volatile memory element portions 323, which are portions of the at least one non-volatile memory element layer 303 that are not in contact with the oxygen-scavenger material portion 335.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. All of the publications, patent applications and patents cited herein are incorporated herein by reference in their entirety.

What is claimed is:

1. A monolithic three-dimensional memory device, comprising:
   a repeating stack of instances of a repetition unit comprising an insulating layer, a oxygen-scavenging material portion, and an electrically conductive word line, wherein the repeating stack is located over a substrate, and the oxygen-scavenging material portion comprises a material having a greater affinity to oxygen than a material of the electrically conductive word line;
   at least one non-volatile memory element layer including oxygen-scavenged non-volatile memory element portions and non-scavenged non-volatile memory element portions;
   at least one bit line extending along a direction of repetition in the repeating stack; and
   at least one non-linear element material layer located between the at least one bit line and the at least one non-volatile memory element layer.

2. The monolithic three-dimensional memory device of claim 1, further comprising middle electrodes located between the at least one non-linear element material layer and the at least one non-volatile memory element layer at same levels as the insulating layers, and contacting a respective oxygen-scavenged non-volatile memory element portion.

3. The monolithic three-dimensional memory device of claim 2, wherein:
   a material composition of the oxygen-scavenged non-volatile memory element portions differs from a composition of the non-scavenged non-volatile memory element portions by a lower atomic oxygen concentration;
   sidewalls of the insulating layers are recessed with respect to sidewalls of the oxygen-scavenging material portions; and
   each middle electrode contacts a sidewall and a bottom surface of a respective oxygen-scavenged non-volatile memory element portion.

4. The monolithic three-dimensional memory device of claim 3, wherein each of the middle electrodes contacts a bottom surface of an overlying non-scavenged non-volatile memory element portion and a top surface of an underlying non-scavenged non-volatile memory element portion.

5. The monolithic three-dimensional memory device of claim 2, wherein the oxygen-scavenged non-volatile memory material portions do not physically contact the at least one non-linear element material layer, but are laterally spaced from the at least one non-linear element material layer by a respective middle electrode.

6. The monolithic three-dimensional memory device of claim 1, wherein the at least one non-linear element material layer comprises a continuous non-linear element material layer that contacts the middle electrodes and extends along the direction of repetition in the repeating stack.

7. The monolithic three-dimensional memory device of claim 1, wherein the at least one non-linear element material layer comprises:

a plurality of discrete non-linear element material layers, wherein each of the plurality of discrete non-linear element material layers contacts only one of the middle electrodes; or an assembly of a semiconductor channel layer and a gate dielectric layer, for which the at least one bit line functions as a gate electrode.

8. The monolithic three-dimensional memory device of claim 1, wherein the repetition unit of the repeating stack further comprises a dielectric blocking material portion that retards diffusion of metallic elements and contacting a respective insulating layer and an element selected from an overlying oxygen-scavenging material portion and an underlying electrically conductive word line.

9. The monolithic three-dimensional memory device of claim 1, wherein the middle electrodes have laterally protruding surfaces that protrude away from a respective insulating layer located at a same level.

10. The monolithic three-dimensional memory device of claim 1, wherein the at least one bit line is at least one electrically conductive bit line including a conductive material.

* * * * *